(12) United States Patent
Adachi et al.

(10) Patent No.: US 10,375,828 B2
(45) Date of Patent: Aug. 6, 2019

(54) PRINTED WIRING BOARD

(71) Applicant: IBIDEN CO., LTD., Ogaki (JP)

(72) Inventors: Takema Adachi, Ogaki (JP); Toshihide Makino, Ogaki (JP); Hidetoshi Noguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/166,392

(22) Filed: Oct. 22, 2018

(65) Prior Publication Data

US 2019/0124766 A1    Apr. 25, 2019

(30) Foreign Application Priority Data

Oct. 24, 2017  (JP) ................................. 2017-204928

(51) Int. Cl.
*H05K 1/11*    (2006.01)
*H05K 1/16*    (2006.01)
*H05K 1/02*    (2006.01)

(52) U.S. Cl.
CPC ........... *H05K 1/115* (2013.01); *H05K 1/0298* (2013.01); *H05K 1/16* (2013.01)

(58) Field of Classification Search
CPC ......... H05K 1/115; H05K 1/0298; H05K 1/16
USPC ........................................................ 174/262
See application file for complete search history.

(56) References Cited

U.S. PATENT DOCUMENTS

| 2013/0020120 | A1* | 1/2013 | Ishihara | H05K 1/183 |
| | | | | 174/262 |
| 2015/0334844 | A1* | 11/2015 | Shimabe | H05K 1/032 |
| | | | | 361/761 |
| 2016/0316566 | A1* | 10/2016 | Sakai | H05K 1/185 |

FOREIGN PATENT DOCUMENTS

JP    2012-156525 A    8/2012

* cited by examiner

*Primary Examiner* — Tremesha S Willis
(74) *Attorney, Agent, or Firm* — Oblon, McClelland, Maier & Neustadt, L.L.P.

(57) ABSTRACT

A printed wiring board includes: a core substrate having a core layer and first and second conductor layers; a first build-up layer including a first insulating layer, an inner first conductor layer, an outermost first insulating layer, and an outermost first conductor layer; and a second build-up layer including a second insulating layer, an inner second conductor layer, an outermost second insulating layer, and an outermost second conductor layer. Each conductor layer includes metal foil, seed layer, and electrolytic plating film, t1/T1, t2/T2, u1/U1 and u2/U2 are smaller than 1, and s1/S1 and s2/S2 are larger than 1, where t1, t2, u1, u2, s1 and s2 are electrolytic plating film thicknesses of the first and second and outermost and inner first and second conductor layers, T1, T2, U1, U2, S1 and S2 are metal foil thicknesses of the first and second and outermost and inner first and second conductor layers.

20 Claims, 9 Drawing Sheets

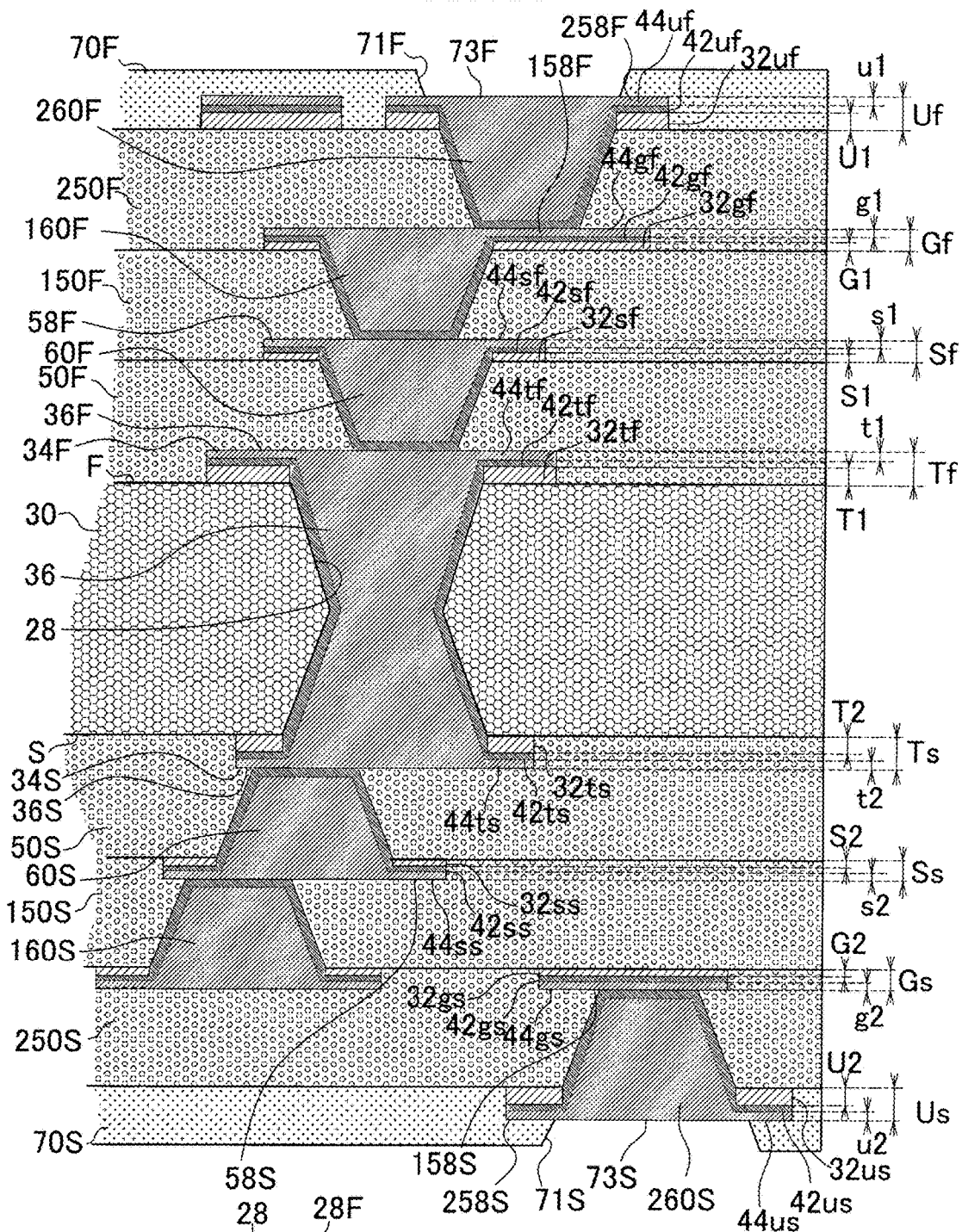
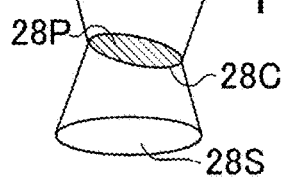
FIG. 2A
FIG. 2B

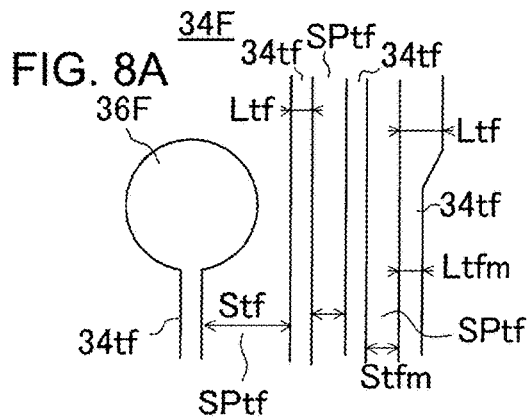
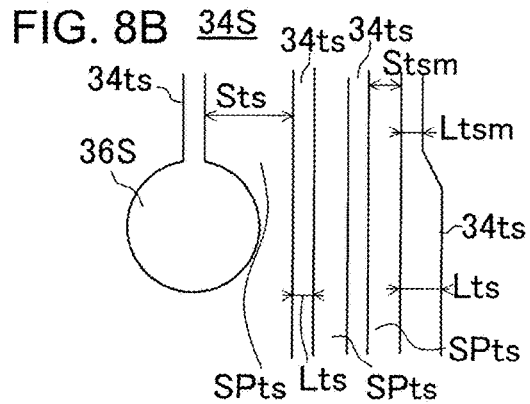
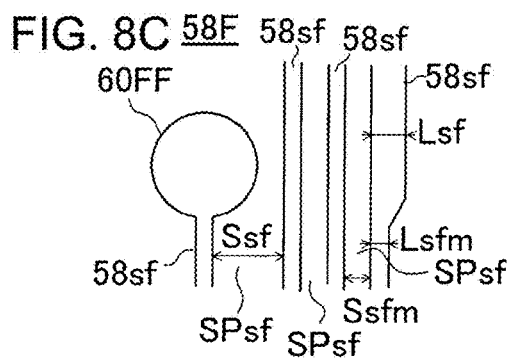
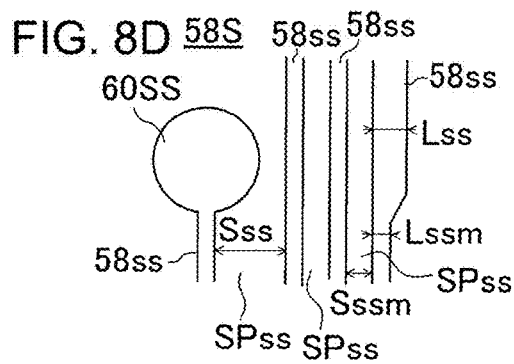
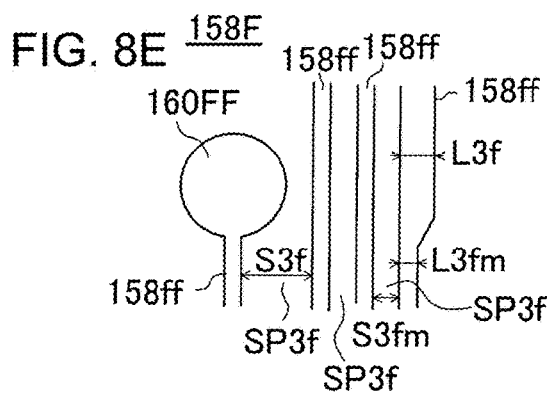
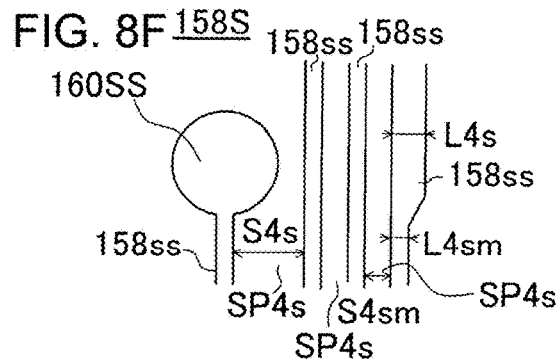
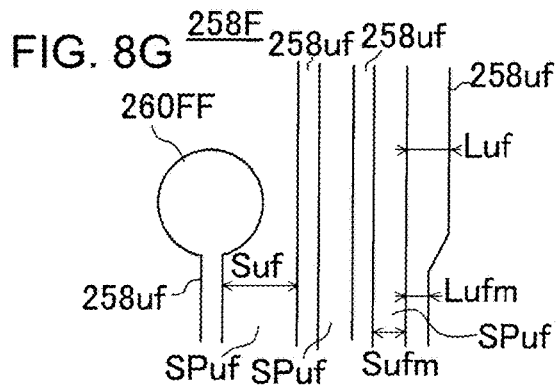
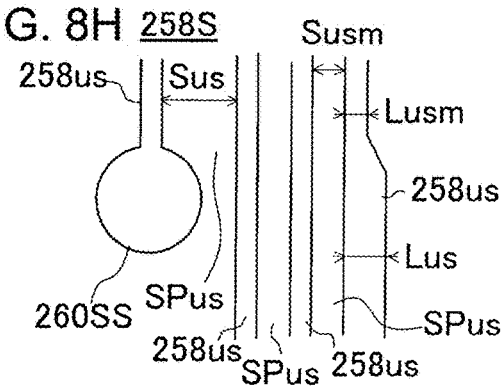

PRINTED WIRING BOARD

CROSS-REFERENCE TO RELATED APPLICATIONS

The present application is based upon and claims the benefit of priority to Japanese Patent Application No. 2017-204928, filed Oct. 24, 2017, the entire contents of which are incorporated herein by reference.

BACKGROUND OF THE INVENTION

Field of the Invention

The present invention relates to a printed wiring board having a core substrate and conductor layers and resin insulating layers that are alternately laminated on the core substrate.

Description of Background Art

Japanese Patent Laid-Open Publication No. 2012-156525 describes a multilayer printed wiring board and a method for manufacturing the multilayer printed wiring board. In the printed wiring board, insulating layers and conductor layers are alternately laminated, and adjacent conductor layers are connected to each other by via holes formed in the insulating layers. The entire contents of this publication are incorporated herein by reference.

SUMMARY OF THE INVENTION

According to one aspect of the present invention, a printed wiring board includes: a core substrate having a core layer, a first conductor layer formed on a first surface of the core layer, a second conductor layer formed on a second surface of the core layer on the opposite side with respect to the first surface, and through-hole conductors penetrating through the core layer and connecting the first conductor layer and the second conductor layer; a first build-up layer including a first resin insulating layer formed on a first surface side of the core substrate, an inner side first conductor layer formed on the first resin insulating layer, first via conductors penetrating through the first resin insulating layer and electrically connecting the first conductor layer and the inner side first conductor layer, an outermost first resin insulating layer formed on the inner side first conductor layer, an outermost first conductor layer formed on the outermost first resin insulating layer, and outermost first via conductors penetrating through the outermost first resin insulating layer and electrically connecting the inner side first conductor layer and the outermost first conductor layer; and a second build-up layer including a second resin insulating layer formed on a second surface side of the core substrate on the opposite side with respect to the first surface side of the core substrate, an inner side second conductor layer formed on the second resin insulating layer, second via conductors penetrating through the second resin insulating layer and electrically connecting the second conductor layer and the inner side second conductor layer, an outermost second resin insulating layer formed on the inner side second conductor layer, an outermost second conductor layer formed on the outermost second resin insulating layer, and outermost second via conductors penetrating through the outermost second resin insulating layer and electrically connecting the inner side second conductor layer and the outermost second conductor layer. The core substrate and the first and second build-up layers are formed such that each of the first and second conductor layers, the inner side first and second conductor layers, and the outermost first and second conductor layers includes a metal foil, a seed layer formed on the metal foil, and an electrolytic plating film formed on the seed layer, that the first via conductors include the electrolytic plating film of the inner side first conductor layer, that the second via conductors include the electrolytic plating film of the inner side second conductor layer, that the outermost first via conductors include the electrolytic plating film of the outermost first conductor layer, that the outermost second via conductors include the electrolytic plating film of the outermost second conductor layer, and that a ratio $t1/T1$ is smaller than 1, a ratio $t2/T2$ is smaller than 1, a ratio $u1/U1$ is smaller than 1, a ratio $u2/U2$ is smaller than 1, a ratio $s1/S1$ is larger than 1, and a ratio $s2/S2$ is larger than 1, where $t1$ is a thickness of the electrolytic plating film of the first conductor layer, $T1$ is a thickness of the metal foil of the first conductor layer, $t2$ is a thickness of the electrolytic plating film of the second conductor layer, $T2$ is a thickness of the metal foil of the second conductor layer, $u1$ is a thickness of the electrolytic plating film of the outermost first conductor layer, $U1$ is a thickness of the metal foil of the outermost first conductor layer, $u2$ is a thickness of the electrolytic plating film of the outermost second conductor layer, $U2$ is a thickness of the metal foil of the outermost second conductor layer, $s1$ is a thickness of the electrolytic plating film of the inner side first conductor layer, $S1$ is a thickness of the metal foil of the inner side first conductor layer, $s2$ is a thickness of the electrolytic plating film of the inner side second conductor layer, and $S2$ is a thickness of the metal foil of the inner side second conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is an enlarged view of the printed wiring board of the embodiment;

FIG. 2B is an explanatory diagram of a through hole;

FIG. 8A-8H are plan views of conductor layers of the printed wiring board of the embodiment.

DETAILED DESCRIPTION OF THE EMBODIMENTS

Figure 1A:
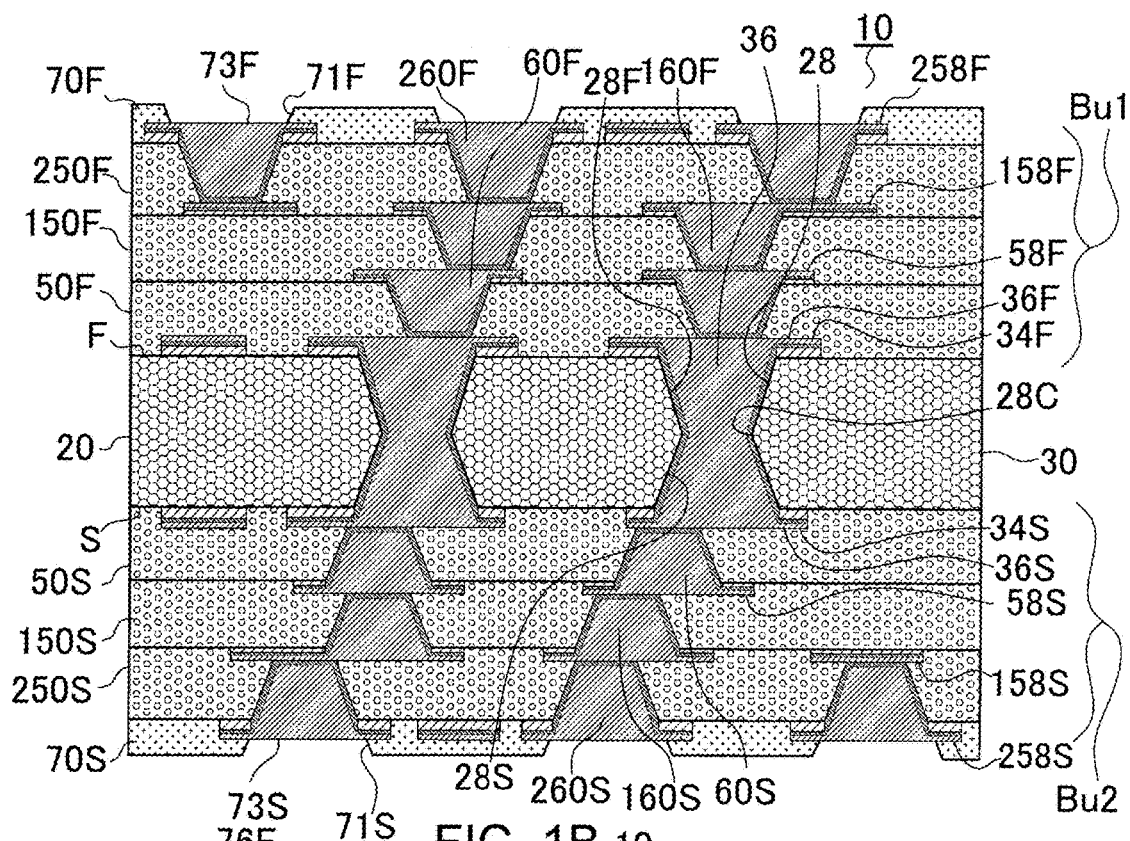
FIGS. 1A and 1B respectively illustrate cross-sectional views of a printed wiring board and a printed wiring board having solder bumps according to an embodiment of the present invention.

Embodiments will now be described with reference to the accompanying drawings, wherein like reference numerals designate corresponding or identical elements throughout the various drawings.

Embodiment

FIG. 1A is a cross-sectional view of a printed wiring board according to an embodiment.

A printed wiring board 10 has a core substrate 30 that has a first surface (F) and a second surface (S) on an opposite side with respect to the first surface (F). The core substrate 30 is formed by a core layer 20 that has a first surface (F) and a second surface (S) on an opposite side with respect to the first surface (F), a first conductor layer (34F) formed on the first surface (F) of the core layer 20, a second conductor layer (34S) formed on the second surface (S) of the core layer 20, and through-hole conductors 36 that penetrate the core layer 20 and connect the first conductor layer (34F) and the second conductor layer (34S) to each other. The core layer 20 is formed of a resin, a reinforcing material, and inorganic particles. An example of the resin is an epoxy resin, an example of the reinforcing material is a glass cloth, and an example of inorganic particles is silica particles. The core layer 20 has through holes 28 that are each formed from a first opening (28F) tapering from the first surface (F) toward the second surface (S) and a second opening (28S) tapering from the second surface (S) toward the first surface (F). The through-hole conductors 36 are formed by filling the through holes 28 with plating. The first surface (F) of the core substrate 30 and the first surface (F) of the core layer 20 are the same surface, and the second surface (S) of the core substrate 30 and the second surface (S) of the core layer 20 are the same surface.

The printed wiring board further has a first build-up layer (Bu1) on the first surface (F) of the core substrate 30. The first build-up layer (Bu1) includes a first resin insulating layer (50F) formed on the first surface (F) of the core substrate 30 and on the first conductor layer (34F), an inner side first conductor layer (58F) formed on the first resin insulating layer (50F), first via conductors (60F) penetrating the first resin insulating layer (50F) and electrically connecting the first conductor layer (34F) and the inner side first conductor layer (58F) to each other, a third resin insulating layer (150F) formed on the first resin insulating layer (50F) and on the inner side first conductor layer (58F), an inner side third conductor layer (158F) formed on the third resin insulating layer (150F), third via conductors (160F) penetrating the third resin insulating layer (150F) and electrically connecting the inner side first conductor layer (58F) and the inner side third conductor layer (158F) to each other, an outermost first resin insulating layer (250F) formed on the third resin insulating layer (150F) and on the inner side third conductor layer (158F), an outermost first conductor layer (258F) formed on the outermost first resin insulating layer (250F), and outermost first via conductors (260F) penetrating the outermost first resin insulating layer (250F) and electrically connecting the inner side third conductor layer (158F) and the outermost first conductor layer (258F) to each other.

The printed wiring board further has a second build-up layer (Bu2) on the second surface (S) of the core substrate 30. The second build-up layer (Bu2) includes a second resin insulating layer (50S) formed on the second surface (S) of the core substrate 30 and on the second conductor layer (34S), an inner side second conductor layer (58S) formed on the second resin insulating layer (50S), second via conductors (60S) penetrating the second resin insulating layer (50S) and electrically connecting the second conductor layer (34S) and the inner side second conductor layer (58S) to each other, a fourth resin insulating layer (150S) formed on the second resin insulating layer (50S) and on the inner side second conductor layer (58S), an inner side fourth conductor layer (158S) formed on the fourth resin insulating layer (150S), fourth via conductors (160S) penetrating the fourth resin insulating layer (150S) and electrically connecting the inner side second conductor layer (58S) and the inner side fourth conductor layer (158S) to each other, an outermost second resin insulating layer (250S) formed on the fourth resin insulating layer (150S) and on the inner side fourth conductor layer (158S), an outermost second conductor layer (258S) formed on the outermost second resin insulating layer (250S), and outermost second via conductors (260S) penetrating the outermost second resin insulating layer (250S) and electrically connecting the inner side fourth conductor layer (158S) and the outermost second conductor layer (258S) to each other.

The resin insulating layers belonging to the first build-up layer (Bu1) and the second build-up layer (Bu2) are each formed of a resin, a reinforcing material, and inorganic particles. Examples of these materials are the same as the examples of the materials for the core layer.

A first solder resist layer (70F) having first openings (71F) is formed on the first build-up layer (Bu1). The outermost first conductor layer (258F) exposed from the first openings (71F) forms first pads (73F) for mounting an electronic component.

A second solder resist layer (70S) having second openings (71S) is formed on the second build-up layer (Bu2). The outermost second conductor layer (258S) exposed from the second openings (71S) forms second pads (73S) for mounting an electronic component.

Figure 3A:
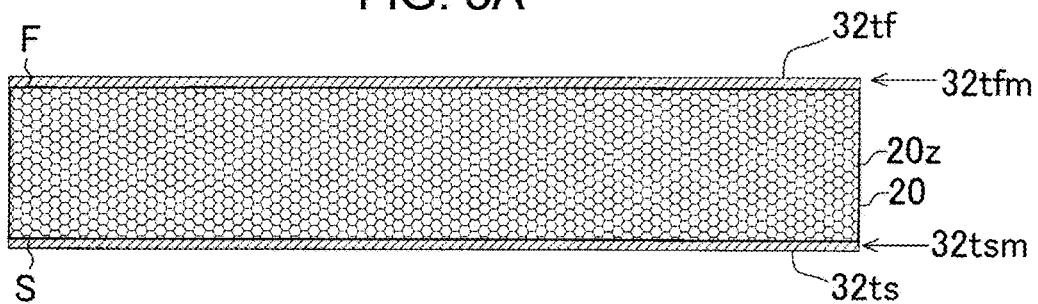
FIG. 3A-3D are manufacturing process diagrams of the printed wiring board of the embodiment.
Figure 3B:
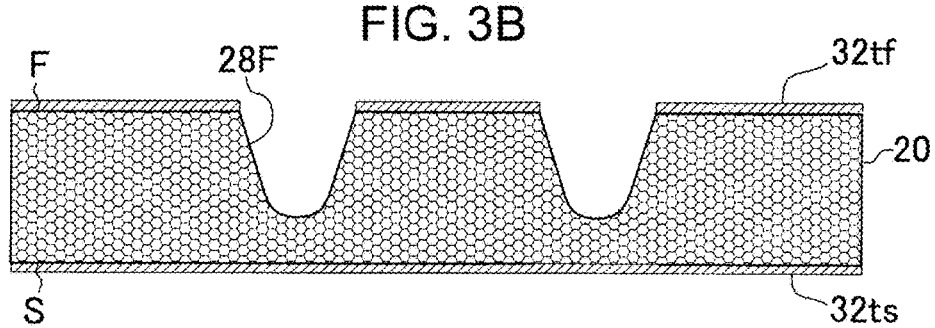
Figure 3C:
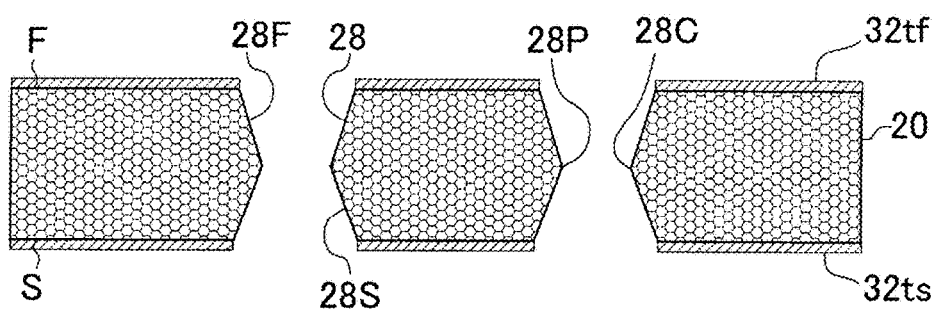

As illustrated in FIG. 3C, the through holes 28 are each formed by the first opening (28F) and the second opening (28S). As illustrated in FIG. 2B, the first opening (28F) and the second opening (28S) are connected to each other at a joining area (28P). In FIG. 2B, oblique lines are drawn in the joining area (28P). An outer periphery of the joining area (28P) is referred to as a neck part (28C). The through-hole conductors 36 of the embodiment are respectively formed in such through holes 28. Therefore, the through-hole conductors 36 bend at the neck parts (28C). Therefore, when the through-hole conductors 36 of the embodiment are subjected to a stress, connection reliability is likely to decrease. However, from a point of view of thicknesses of the conductor layers formed in the core substrate and the build-up layers, the through-hole conductors 36 of the embodiment are unlikely to deteriorate.

The first conductor layer (34F) has first through-hole lands (36F) that are respectively directly connected to the through-hole conductors 36. The first through-hole lands (36F) are respectively positioned directly on the through-hole conductors 36 and respectively extend from the through-hole conductors 36.

The second conductor layer (34S) has second through-hole lands (36S) that are respectively directly connected to the through-hole conductors 36. The second through-hole lands (36S) are respectively positioned directly on the through-hole conductors 36 and respectively extend from the through-hole conductors 36.

The through-hole conductors 36 respectively connect the first through-hole lands (36F) to the second through-hole lands (36S).

FIG. 2A is an enlarged view of the printed wiring board illustrated in FIG. 1A. The first conductor layer (34F) includes a first metal foil (tf) formed on the first surface (F) of the core layer 20, a first seed layer (42t1) formed on the first metal foil (tf), and a first electrolytic plating film (44tf) formed on the first seed layer (42tf). The second conductor layer (34S) includes a second metal foil (ts) formed on the second surface (S) of the core layer 20, a second seed layer (42ts) formed on the second metal foil (ts), and a second electrolytic plating film (44ts) formed on the second seed layer (42ts).

The inner side first conductor layer (58F) includes an inner side first metal foil (32sf) formed on the first resin insulating layer (50F), an inner side first seed layer (42sf) formed on the inner side first metal foil (32sf), and an inner side first electrolytic plating film (44sf) formed on the inner side first seed layer (42sf).

The inner side second conductor layer (58S) includes an inner side second metal foil (32ss) formed on the second resin insulating layer (50S), an inner side second seed layer (42ss) formed on the inner side second metal foil (32ss), and an inner side second electrolytic plating film (44ss) formed on the inner side second seed layer (42ss).

The inner side third conductor layer (158F) includes an inner side third metal foil (32gf) formed on the third resin insulating layer (150F), an inner side third seed layer (42gf) formed on the inner side third metal foil (32gf), and an inner side third electrolytic plating film (44gf) formed on the inner side third seed layer (42gf).

The inner side fourth conductor layer (158S) includes an inner side fourth metal foil (32gs) formed on the fourth resin insulating layer (150S), an inner side fourth seed layer (42gs) formed on the inner side fourth metal foil (32gs), and an inner side fourth electrolytic plating film (44gs) formed on the inner side fourth seed layer (42gs).

The outermost first conductor layer (258F) includes an outermost first metal foil (32uf) formed on the outermost first resin insulating layer (250F), an outermost first seed layer (42uf) formed on the outermost first metal foil (32uf), and an outermost first electrolytic plating film (44uf) formed on the outermost first seed layer (42uf).

The outermost second conductor layer (258S) includes an outermost second metal foil (32us) formed on the outermost second resin insulating layer (250S), an outermost second seed layer (42us) formed on the outermost second metal foil (32us), and an outermost second electrolytic plating film (44us) formed on the outermost second seed layer (42us).

The conductor layers belonging to the first build-up layer (Bu1) and the second build-up layer (Bu2) are classified into outermost conductor layers and inner side conductor layers. In FIG. 2A, the outermost conductor layers are the outermost first conductor layer (258F) and the outermost second conductor layer (258S). The inner side conductor layers are the inner side first conductor layer (58F), the inner side second conductor layer (58S), the inner side third conductor layer (158F), and the inner side fourth conductor layer (158S).

The first conductor layer (34F) has a thickness (Tf). The second conductor layer (34S) has a thickness (Ts). The inner side first conductor layer (58F) has a thickness (Sf). The inner side second conductor layer (58S) has a thickness (Ss). The inner side third conductor layer (158F) has a thickness (Gf). The inner side fourth conductor layer (158S) has a thickness (Gs). The outermost first conductor layer (258F) has a thickness (Uf). The outermost second conductor layer (258S) has a thickness (Us).

The thickness of at least one inner side conductor layer in the first build-up layer (Bu1) is smaller than the thickness (Tf) of the first conductor layer (34F). The thickness (Tf) of the first conductor layer (34F), the thickness (Ts) of the second conductor layer (34S), the thickness (Uf) of the outermost first conductor layer (258F) and the thickness (Us) of the outermost second conductor layer (258S) are substantially equal to each other.

When the first build-up layer (Bu1) has multiple inner side conductor layers, the inner side conductor layers in the first build-up layer (Bu1) include one or more inner side conductor layers each having a small thickness and one or more inner side conductor layers each having a large thickness. Then, the thickness of an inner side conductor layer having a small thickness is smaller than the thickness (Tf) of the first conductor layer (34F). Further, the thickness of an inner side conductor layer having a large thickness is substantially equal to the thickness (Tf) of the first conductor layer (34F).

The number of the inner side conductor layers each having a small thickness is larger than the number of the inner side conductor layers each having a large thickness.

The thickness of at least one inner side conductor layer in the second build-up layer (Bu2) is smaller than the thickness (Tf) of the first conductor layer (34F). The thickness (Tf) of the first conductor layer (34F), the thickness (Ts) of the second conductor layer (34S), the thickness (Uf) of the outermost first conductor layer (258F) and the thickness (Us) of the outermost second conductor layer (258S) are substantially equal to each other.

When the second build-up layer (Bu2) has multiple inner side conductor layers, the inner side conductor layers in the second build-up layer (Bu2) include one or more inner side conductor layers each having a small thickness and one or more inner side conductor layers each having a large thickness. Then, the thickness of an inner side conductor layer having a small thickness is smaller than the thickness (Tf) of the first conductor layer (34F). Further, the thickness of an inner side conductor layer having a large thickness is substantially equal to the thickness (Tf) of the first conductor layer (34F).

The number of the inner side conductor layers each having a small thickness is larger than the number of the inner side conductor layers each having a large thickness.

The inner side conductor layers in the first build-up layer (Bu1) include one or more inner side conductor layers each having a small thickness and one or more inner side conductor layers each having a large thickness, and the inner side conductor layers in the second build-up layer (Bu2) include one or more inner side conductor layers each having a small thickness and one or more inner side conductor layers each having a large thickness. In this case, the thickness of an inner side conductor layer having a small thickness in the first build-up layer (Bu1) and the thickness of an inner side conductor layer having a small thickness in the second build-up layer (Bu2) are substantially equal to each other. The thickness of an inner side conductor layer having a large thickness in the first build-up layer (Bu1) and the thickness of an inner side conductor layer having a large thickness in the second build-up layer (Bu2) are substantially equal to each other. The thickness of an inner side conductor layer having a large thickness in the first build-up layer (Bu1) and the thickness of an inner side conductor layer having a large thickness in the second build-up layer (Bu2) are substantially equal to the thickness (Tf) of the first conductor layer (34F).

Figure 9:
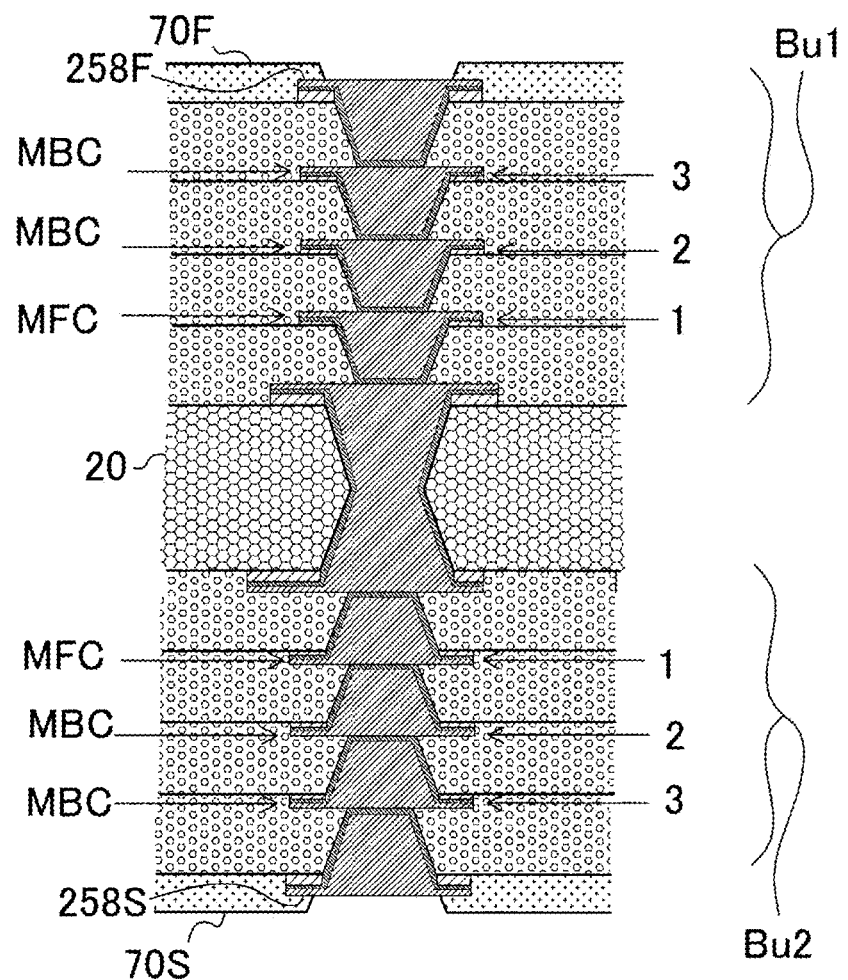
FIG. 9 is an explanatory diagram of the printed wiring board of the embodiment.

The inner side conductor layers in the first build-up layer (Bu1) include one or more inner side conductor layers each having a small thickness and one or more inner side conductor layers each having a large thickness, and the inner side conductor layers in the second build-up layer (Bu2) include one or more inner side conductor layers each having a small thickness and one or more inner side conductor layers each having a large thickness. In this case, the one or more inner side conductor layers each having a small thickness in the first build-up layer (Bu1) and the one or more inner side conductor layers each having a small thickness in the second build-up layer (Bu2) are symmetrically formed with respect to the core substrate. Similarly, the one or more inner side conductor layers each having a large thickness in the first build-up layer (Bu1) and the one or more inner side conductor layers each having a large thickness in the second build-up layer (Bu2) are symmetrically formed with respect to the core substrate. An example of this case is illustrated in FIG. 9. In FIG. 9, numbers are sequentially assigned to the conductor layers. The number "1" is assigned to the inner side conductor layers closest to the core substrate 30, and the largest number is assigned to the inner side conductor layers closest to the outermost conductor layers (258F, 258S).

As illustrated in FIG. 9, when the inner side conductor layer indicated by the number "1" in the first build-up layer is an inner side conductor layer (MFC) having a large thickness, the inner side conductor layer indicated by the number "1" in the second build-up layer is an inner side conductor layer (MFC) having a large thickness. The other inner side conductor layers (2, 3) are conductor layers (MBC) each having a small thickness.

When the inner side conductor layers respectively indicated by the numbers "1" and "3" in the first build-up layer (Bu1) are inner side conductor layers (MFC) each having a large thickness, the inner side conductor layers respectively indicated by the numbers "1" and "3" in the second build-up layer (Bu2) are inner side conductor layers (MFC) each having a large thickness. Then, when the conductor layer indicated by the number "2" in the first build-up layer (Bu1) is an inner side conductor layer (MBC) having a small thickness, the inner side conductor layer indicated by the number "2" in the second build-up layer (Bu2) is an inner side conductor layer (MBC) having a small thickness.

In the example of the printed wiring board 10 illustrated in FIG. 2A, the inner side first conductor layer (58F) and the inner side second conductor layer (58S) belong to the inner side conductor layers each having a small thickness, and the inner side third conductor layer (158F) and the inner side fourth conductor layer (158S) belong to the inner side conductor layers each having a large thickness. Then, the thickness (Tf) of the first conductor layer (34F) is larger than the thickness (Sf) of the inner side first conductor layer (58F). The thickness (Tf) of the first conductor layer (34F) is larger than the thickness (Ss) of the inner side second conductor layer (58S). The thickness (Sf) of the inner side first conductor layer (58F) and the thickness (Ss) of the inner side second conductor layer (58S) are substantially equal to each other. The thickness (Of) of the inner side third conductor layer (158F) and the thickness (Gs) of the inner side fourth conductor layer (158S) are substantially equal to the thickness (Tf) of the first conductor layer (34F).

The thickness (Sf) of the inner side first conductor layer (58F) is the smallest among the thickness (Tf) of the first conductor layer (34F), the thickness (Ts) of the second conductor layer (34S), the thickness (Sf) of the inner side first conductor layer (58F), the thickness (Uf) of the outermost first conductor layer (258F), and the thickness (Us) of the outermost second conductor layer (258S). The thickness (Ss) of the inner side second conductor layer (58S) is the smallest among the thickness (Tf) of the first conductor layer (34F), the thickness (Ts) of the second conductor layer (34S), the thickness (Ss) of the inner side second conductor layer (58S), the thickness (Uf) of the outermost first conductor layer (258F), and the thickness (Us) of the outermost second conductor layer (258S).

A thickness of a metal foil forming a conductor layer relates to a thickness of the conductor layer. That is, a thickness of a metal foil forming a conductor layer having a large thickness is larger than a thickness of a metal foil forming a conductor layer having a small thickness. A thickness of a metal foil forming an inner side conductor layer having a small thickness is smaller than a thickness of a metal foil forming an inner side conductor layer having a large thickness. A thickness of a metal foil forming an inner side conductor layer having a small thickness is smaller than a thickness of a metal foil (the outermost first metal foil (32$uf$) or the outermost second metal foil (32$us$)) forming an outermost conductor layer (the outermost first conductor layer (258F) or the outermost second conductor layer (258S)). A thickness of a metal foil forming an inner side conductor layer having a small thickness is smaller than a thickness of a metal foil (the first metal foil (tf) or the second metal foil (ts)) forming a conductor layer (the first conductor layer (34F) or the second conductor layer (34S)) of the core substrate. A thickness of a metal foil forming an inner side conductor layer having a large thickness, a thickness of a metal foil forming an outermost conductor layer, and a thickness of a metal foil forming a conductor layer of the core substrate are substantially equal to each other.

For example, a thickness (S1) of the inner side first metal foil (32$sf$) is the smallest among a thickness (T1) of the first metal foil (tf), a thickness (T2) of the second metal foil (ts), the thickness (S1) of the inner side first metal foil (32$sf$), a thickness (U1) of the outermost first metal foil (32$uf$), and a thickness (U2) of the outermost second metal foil (32$us$). A thickness (S2) of the inner side second metal foil (32$ss$) is the smallest among the thickness (T1) of the first metal foil (tf), the thickness (T2) of the second metal foil (ts), the thickness (S2) of the inner side second metal foil (32$ss$), the thickness (U1) of the outermost first metal foil (32$uf$), and the thickness (U2) of the outermost second metal foil (32$us$).

A ratio ((a thickness of an electrolytic plating film)/(a thickness of a metal foil)) (R) of a thickness of an electrolytic plating film (for example, an electrolytic copper plating film) forming a conductor layer to a thickness of a metal foil (for example, a copper foil) forming the conductor layer relates to the thickness of the metal foil forming the conductor layer. When the thickness of the metal foil is large, the ratio (R) is smaller than 1. When the thickness of the metal foil is small, the ratio (R) is larger than 1. That is, for a conductor layer having a small thickness, the ratio (R) is larger than 1. For a conductor layer having a large thickness, the ratio (R) is smaller than 1.

A thickness of the first electrolytic plating film (44$tf$) forming the first conductor layer (34F) is a thickness (t1), and a thickness of the second electrolytic plating film (44$ts$) forming the second conductor layer (34S) is a thickness (t2). A thickness of the inner side first electrolytic plating film (44$sf$) forming the inner side first conductor layer (58F) is a thickness (s1), and a thickness of the inner side second electrolytic plating film (44ss) forming the inner side second conductor layer (58S) is a thickness (s2). A thickness of the inner side third electrolytic plating film (44gf) forming the inner side third conductor layer (158F) is a thickness (g1), and a thickness of the inner side fourth electrolytic plating film (44gs) forming the inner side fourth conductor layer (158S) is a thickness (g2). A thickness of the outermost first electrolytic plating film (44uf) forming the outermost first conductor layer (258F) is a thickness (u1), and a thickness of the outermost second electrolytic plating film (44us) forming the outermost second conductor layer (258S) is a thickness (u2).

For example, a ratio (t1/T1) of the thickness (t1) of the first electrolytic plating film (44tf) to the thickness (T1) of the first metal foil (tf) is smaller than 1. A ratio (t2/T2) of the thickness (t2) of the second electrolytic plating film (44ts) of the second conductor layer (34S) to the thickness (T2) of the second metal foil (ts) is smaller than 1. A ratio (u1/U1) of the thickness (u1) of the outermost first electrolytic plating film (44uf) to the thickness (U1) of the outermost first metal foil (32uf) is smaller than 1. A ratio (u2/U2) of the thickness (u2) of the outermost second electrolytic plating film (44us) to the thickness (U2) of the outermost second metal foil (32us) is smaller than 1. A ratio (s1/S1) of the thickness (s1) of the inner side first electrolytic plating film (44sf) to the thickness (S1) of the inner side first metal foil (32sf) is larger than 1. A ratio (s2/S2) of the thickness (s2) of the inner side second electrolytic plating film (44ss) to the thickness (S2) of the inner side second metal foil (32ss) is larger than 1.

For a conductor layer having a small thickness, the ratio ((the thickness of the electrolytic plating film)/(the thickness of the metal foil)) of the thickness of the electrolytic plating film forming the conductor layer to the thickness of the metal foil forming the conductor layer is 1.5 or more and 4.0 or less. Further, for a conductor layer having a large thickness, the ratio ((the thickness of the electrolytic plating film)/(the thickness of the metal foil)) of the thickness of the electrolytic plating film forming the conductor layer to the thickness of the metal foil forming the conductor layer is 0.6 or more and 0.9 or less. For example, the ratio (t1/T1), the ratio (t2/T2), the ratio (u1/U1) and the ratio (u2/U2) are 0.75 or more and 0.85 or less, and the ratio (s1/S1) and the ratio (s2/S2) are 2.5 or more and 3.5 or less.

In the printed wiring board of the embodiment, the outermost first conductor layer (258F) and the outermost second conductor layer (258S) belong to the conductor layers each having a large thickness. Therefore, the thickness (U1) of the outermost first metal foil (32uf) forming the outermost first conductor layer (258F) and the thickness (U2) of the outermost second metal foil (32us) forming the outermost second conductor layer (258S) can be increased. The printed wiring board 10 is reinforced by these outermost metal foils. The printed wiring board is reinforced by the conductor layers positioned outermost. Therefore, warpage of the printed wiring board can be reduced. Connection reliability between the first conductor layer (34F) and the second conductor layer (34S) via the through-hole conductors 36 can be increased. Connection reliability between an electronic component mounted on the outermost first conductor layer (258F) and the printed wiring board 10 can be increased. Connection reliability between an electronic component mounted on the outermost second conductor layer (258S) and the printed wiring board 10 can be increased.

The inner side conductor layers in the first build-up layer (Bu1) include one or more conductor layers each having a small thickness, and the inner side conductor layers in the second build-up layer (Bu2) include one or more conductor layers each having a small thickness. Therefore, fine conductor circuits can be formed in the inner side conductor layers. For example, when the inner side first conductor layer (58F), the inner side second conductor layer (58S), the inner side third conductor layer (158F) and the inner side fourth conductor layer (158S) are each formed by a conductor layer having a small thickness, the inner side first conductor layer (58F), the inner side second conductor layer (58S), the inner side third conductor layer (158F) and the inner side fourth conductor layer (158S) can each have fine conductor circuits. Therefore, a wiring density of the printed wiring board 10 of the embodiment can be increased. A size or thickness of the printed wiring board can be reduced. In this example, the first build-up layer (Bu1) and the second build-up layer (Bu2) both include multiple inner side conductor layers. And, all of the inner side conductor layers belong to the conductor layers each having a small thickness.

The core substrate 30 is positioned substantially at a center in a thickness direction of the printed wiring board 10. Therefore, when the printed wiring board 10 is subjected to heat cycles, a generated thermal stress is likely to concentrate on the core substrate 30. However, in the printed wiring board 10 of the embodiment, the first conductor layer (34F) and the second conductor layer (34S) that form the core substrate belong to the conductor layers each having a large thickness. Therefore, the thickness (T1) of the first metal foil (tf) forming the first conductor layer (34F) and the thickness (T2) of the second metal foil (ts) forming the second conductor layer (34S) can be increased. As a result, the core substrate 30 is reinforced. Therefore, the connection reliability via the through-hole conductors 36 can be increased. The thicknesses (Tf, Ts) of the conductor layers (34F, 34S) forming the core substrate 30 are substantially equal to the thicknesses (Uf, Us) of the outermost conductor layers (258F, 258S).

A metal foil forming a conductor layer has a mat surface. Due to an unevenness of the mat surface, the conductor layer is bonded to the core layer 20 or a resin insulating layer.

A thickness of a conductor layer or a thickness of a metal foil relates to a size of an unevenness of a mat surface of the metal foil. A size of an unevenness of a mat surface of a metal foil forming a conductor layer having a large thickness is larger than a size of an unevenness of a mat surface of a metal foil forming a conductor layer having a small thickness. A size of an unevenness of a mat surface of a metal foil having a relatively large thickness is larger than a size of an unevenness of a mat surface of a metal foil having a relatively small thickness.

Since the first conductor layer (34F) and the second conductor layer (34S) are conductor layers each having a large thickness, an adhesion strength between the core layer 20 and the first metal foil (tf) and an adhesion strength between the core layer 20 and the second metal foil (ts) can be increased. The first conductor layer (34F) and the second conductor layer (34S) are unlikely to peel off from the core layer 20 by a thermal stress.

In the printed wiring board of the embodiment, the first conductor layer (34F) and the second conductor layer (34S) that are formed in the core substrate 30 are connected to each other by the through-hole conductors 36. The first conductor layer (34F) has the first through-hole lands (36F) respectively formed around and directly on the through-hole conductors 36. The first through-hole lands (36F) respectively formed around the through-hole conductors 36 are formed on the first surface (F) of the core layer 20. Further, the second conductor layer (34S) has the second through-hole lands (36S) respectively formed around and directly on the through-hole conductors 36. The second through-hole lands (36S) respectively formed around the through-hole conductors 36 are formed on the second surface (S) of the core layer 20. The first through-hole lands (36F) and the second through-hole lands (36S) respectively extend from the through-hole conductors 36. The first through-hole lands (36F) and the second through-hole lands (36S) are respectively directly connected to the through-hole conductors 36. The first through-hole lands (36F) are respectively integrally formed with the through-hole conductors 36. The second through-hole lands (36S) are respectively integrally formed with the through-hole conductors 36. Therefore, the connection reliability between the through-hole conductors 36 and first conductor layer (34F) or between the through-hole conductors 36 and the second conductor layer (34S) can be increased.

The inner side conductor layers each having a small thickness are formed in the first build-up layer (Bu1). The inner side conductor layers each having a small thickness are formed in the second build-up layer (Bu2). For example, the thickness (Sf) of the inner side first conductor layer (58F), the thickness (Ss) of the inner side second conductor layer (58S), the thickness (Gf) of the inner side third conductor layer (158F), and the thickness (Gs) of the inner side fourth conductor layer (158S) are small. Therefore, fine conductor circuits can be formed in the inner side conductor layers. The number of the conductor layers and the number of the resin insulating layers can be reduced. The number of the via conductors formed directly on the through-hole conductors 36 can be reduced. Therefore, a stress acting on the through-hole conductors 36 can be reduced. Connection reliability between the first conductor layer (34F) and the second conductor layer (34S) via the through-hole conductors 36 can be increased.

For each of the first conductor layer (34F), the second conductor layer (34S), the outermost first conductor layer (258F), and the outermost second conductor layer (258S), the thickness of the metal foil forming the conductor layer is larger than the thickness of the electrolytic plating film forming the conductor layer. Therefore, variation in the thickness of each of these conductor layers can be reduced. The thickness of each of these conductor layers can be made uniform. This is because variation in the thickness of the metal foil is smaller than variation in the thickness of the electrolytic plating film. Since variation in the thickness of each of the outermost conductor layers is small, for example, flatness of a surface on which an electronic component is mounted or flatness of a surface for connecting to another circuit substrate can be increased. Therefore, connection reliability between the printed wiring board of the embodiment and the electronic component or connection reliability between the printed wiring board of the embodiment and the other circuit substrate can be increased.

Even when the first conductor layer (34F) and the second conductor layer (34S) that form the core substrate 30 are conductor layers each having a large thickness, in the embodiment, the thicknesses of the metal foils forming the conductor layers are larger than the thicknesses of the electrolytic plating films forming the conductor layers. Therefore, variation in the thickness of the first conductor layer (34F) or variation in the thickness of the second conductor layer (34S) can be reduced. For example, flatness of the core substrate 30 can be increased. In the printed wiring board 10 of the embodiment, since the build-up layers are laminated on the core substrate 30, by increasing the flatness of the core substrate 30, for example, the flatness of the surface on which an electronic component is mounted or the flatness of the surface for connecting to another circuit substrate can be increased. Even when the number of the conductor layers included in the first build-up layer (Bu1) is 7 or more, warpage of the printed wiring board 10 can be reduced. Even when the number of the conductor layers included in the second build-up layer (Bu2) is 7 or more, warpage of the printed wiring board 10 can be reduced.

The via conductors are formed by filling openings for the via conductors with an electrolytic plating film. Therefore, when the thickness of the electrolytic plating film is larger than the thickness of the metal foil, the openings for the via conductors can be easily filled with the electrolytic plating film. When the via conductors are formed in the openings for the via conductors, via lands are respectively formed directly on the via conductors and around the via conductors.

Via structures are formed by the via conductors and the via lands. Then, the via structures include outermost via structures and inner side via structures. The via lands of the outermost via structures are formed by the outermost conductor layers. The via lands of the inner side via structures are formed by the inner side conductor layers. In FIG. 2A, the via conductors forming the outermost via structures are the outermost first via conductors (260F) and the outermost second via conductors (260S). In FIG. 2A, the via conductors forming the inner side via structures are the first via conductors (60F), the second via conductors (60S), the third via conductors (160F) and the fourth via conductors (160S).

When a thickness of an electrolytic plating film forming via lands is larger than a thickness of a metal foil forming the via lands, upper surfaces of the via lands are likely to be flat. When a thickness of an electrolytic plating film forming via lands is larger than a thickness of a metal foil forming the via lands, other via conductors can be respectively laminated directly on the via lands. Therefore, in the via lands forming the inner side via structures, the thickness of the electrolytic plating film is preferably larger than the thickness of the metal foil. For example, among the inner side conductor layers in the first build-up layer (Bu1), for ⅔ or more of the inner side conductor layers, the thickness of the electrolytic plating film is larger than the thickness of the metal foil. Similarly, among the inner side conductor layers in the second build-up layer (Bu2), for ⅔ or more of the inner side conductor layers, the thickness of the electrolytic plating film is larger than the thickness of the metal foil.

Another example of FIG. 2A is described below. For the inner side first conductor layer (58F), the inner side second conductor layer (58S), the inner side third conductor layer (158F) and the inner side fourth conductor layer (158S), the thickness of the electrolytic plating film is larger than the thickness of the metal foil. In this example, all of the inner side conductor layers are conductor layers (MBC) each having a small thickness. Therefore, the flatness of the upper surfaces of the via lands of the first via conductors (60F), the second via conductors (60S), the third via conductors (160F) and the fourth via conductors (160S) can be increased. When the thickness of the electrolytic plating film is small, the openings of the via conductors are difficult to be filled. However, in the embodiment, since the thickness of the electrolytic plating film is large, the openings of the via conductors can be filled. When the upper surfaces of the via lands are flat, via conductors can be formed directly on the via structures. A high density printed wiring board can be provided. Further, since the number of the resin insulating layers and the number of the conductor layers can be reduced, warpage of the printed wiring board can be reduced. A stress acting on the through-hole conductors of the core substrate can be reduced.

FIG. 8A is a plan view of the first conductor layer (34F).

The first conductor layer (34F) is formed by the first through-hole lands (36F), multiple first conductor circuits (34*tf*), and multiple first spaces (SPtf). The first spaces (SPtf) are formed between adjacent first conductor circuits (34*tf*). The first conductor circuits (34*tf*) have various first conductor circuit widths (Ltf), and the first conductor circuit widths (Ltf) include a minimum first conductor circuit width (minimum wiring width) (Ltfm). The first spaces (SPtf) have various first space widths (Stf), and the first space widths (Stf) include a minimum first space width (minimum insulation distance) (Stfm). The first space widths (Stf) are distances between adjacent first conductor circuits (34*tf*).

FIG. 8B is a plan view of the second conductor layer (34S).

The second conductor layer (34S) is formed by the second through-hole lands (36S), multiple second conductor circuits (34*ts*), and multiple second spaces (SPts). The second spaces (SPts) are formed between adjacent second conductor circuits (34*ts*). The second conductor circuits (34*ts*) have various second conductor circuit widths (Lts), and the second conductor circuit widths (Lts) include a minimum second conductor circuit width (minimum wiring width) (Ltsm). The second spaces (SPts) have various second space widths (Sts), and the second space widths (Sts) include a minimum second space width (minimum insulation distance) (Stsm). The second space widths (Sts) are distances between adjacent second conductor circuits (34*ts*).

FIG. 8C is a plan view of the inner side first conductor layer (58F).

The inner side first conductor layer (58F) is formed by the first via lands (60FF) respectively formed directly on the first via conductors (60F), multiple inner side first conductor circuits (58*sf*), and multiple inner side first spaces (SPsf). The inner side first spaces (SPsf) are formed between adjacent inner side first conductor circuits (58*sf*). The inner side first conductor circuits (58*sf*) have various inner side first conductor circuit widths (Lsf), and the inner side first conductor circuit widths (Lsf) include a minimum inner side first conductor circuit width (minimum wiring width) (Lsfm). The inner side first spaces (SPsf) have various inner side first space widths (Ssf), and the inner side first space widths (Ssf) include a minimum inner side first space width (minimum insulation distance) (Ssfm). The inner side first space widths (Ssf) are distances between adjacent inner side first conductor circuits (58*sf*).

FIG. 8D is a plan view of the inner side second conductor layer (58S).

The inner side second conductor layer (58S) is formed by the second via lands (60SS) respectively formed directly on the second via conductors (60S), multiple inner side second conductor circuits (58*ss*), and multiple inner side second spaces (SPss). The inner side second spaces (SPss) are formed between adjacent inner side second conductor circuits (58*ss*). The inner side second conductor circuits (58*ss*) have various inner side second conductor circuit widths (Lss), and the inner side second conductor circuit widths (Lss) include a minimum inner side second conductor circuit width (minimum wiring width) (Lssm). The inner side second spaces (SPss) have various inner side second space widths (Sss), and the inner side second space widths (Sss) include a minimum inner side second space width (minimum insulation distance) (Sssm). The inner side second space widths (Sss) are distances between adjacent inner side second conductor circuits (58*ss*).

FIG. 8E is a plan view of the inner side third conductor layer (158F).

The inner side third conductor layer (158F) is formed by the third via lands (160FF) respectively formed directly on the third via conductors (160F), multiple inner side third conductor circuits (158*ff*), and multiple inner side third spaces (SP3*f*). The inner side third spaces (SP3*f*) are formed between adjacent inner side third conductor circuits (158*ff*). The inner side third conductor circuits (158*ff*) have various inner side third conductor circuit widths (L3*f*), and the inner side third conductor circuit widths (L3*f*) include a minimum inner side third conductor circuit width (minimum wiring width) (L3*fm*). The inner side third spaces (SP3*f*) have various inner side third space widths (S3*f*), and the inner side third space widths (S3*f*) include a minimum inner side third space width (minimum insulation distance) (S3*fm*). The inner side third space widths (S3*f*) are distances between adjacent inner side third conductor circuits (158*ff*).

FIG. 8F is a plan view of the inner side fourth conductor layer (158S).

The inner side fourth conductor layer (158S) is formed by the fourth via lands (160SS) respectively formed directly on the fourth via conductors (160S), multiple inner side fourth conductor circuits (158*ss*), and multiple inner side fourth spaces (SP4*s*). The inner side fourth spaces (SP4*s*) are formed between adjacent inner side fourth conductor circuits (158*ss*). The inner side fourth conductor circuits (158*ss*) have various inner side fourth conductor circuit widths (L4*s*). The inner side fourth conductor circuit widths (L4*s*) include a minimum inner side fourth conductor circuit width (minimum wiring width) (L4*sm*). The inner side fourth spaces (SP4*s*) have various inner side fourth space widths (S4*s*), and the inner side fourth space widths (S4*s*) include a minimum inner side fourth space width (minimum insulation distance) (S4*sm*). The inner side fourth space widths (S4*s*) are distances between adjacent inner side fourth conductor circuits (158*ss*.

FIG. 8G is a plan view of the outermost first conductor layer (258F).

The outermost first conductor layer (258F) is formed by the outermost first via lands (260FF) respectively formed directly on the outermost first via conductors (260F), multiple outermost first conductor circuits (258*uf*), and multiple outermost first spaces (SPuf). The outermost first spaces (SPuf) are formed between adjacent outermost first conductor circuits (258*uf*). The outermost first conductor circuits (258*uf*) have various outermost first conductor circuit widths (Luf), and the outermost first conductor circuit width (Luf) include a minimum outermost first conductor circuit width (minimum wiring width) (Lufm). The outermost first spaces (SPuf) have various outermost first space widths (Suf), and the outermost first space widths (Suf) include a minimum outermost first space width (minimum insulation distance) (Sufm). The outermost first space widths (Suf) are distances between adjacent outermost first conductor circuits (258*uf*).

FIG. 8H is a plan view of the outermost second conductor layer (258S).

The outermost second conductor layer (258S) is formed by the outermost second via lands (260SS) respectively formed directly on the outermost second via conductors (260S), multiple outermost second conductor circuits (258*us*), and multiple outermost second spaces (SPus). The outermost second spaces (SPus) are formed between adjacent outermost second conductor circuits (258*us*). The outermost second conductor circuits (258*us*) have various outermost second conductor circuit widths (Lus), and the outermost second conductor circuit widths (Lus) include a minimum outermost second conductor circuit width (minimum wiring width) (Lusm). The outermost second spaces (SPus) have various outermost second space widths (Sus), and the outermost second space widths (Sus) include a minimum outermost second space width (minimum insulation distance) (Susm). The outermost second space widths (Sus) are distances between adjacent outermost second conductor circuits (258us).

The minimum conductor circuit width (minimum wiring width) existing in a conductor layer relates to the thickness of the conductor layer. The minimum conductor circuit width existing in a conductor layer having a large thickness is larger than the minimum conductor circuit width existing in a conductor layer having a small thickness.

The minimum conductor circuit width existing in a conductor layer relates to the thickness of the metal foil forming the conductor layer. The minimum conductor circuit width in a conductor layer formed by a metal foil having a large thickness is larger than the minimum conductor circuit width in a conductor layer formed by a metal foil having a small thickness.

The minimum conductor circuit width existing in a conductor layer relates to the thickness of the electrolytic plating film forming the conductor layer. The minimum conductor circuit width in a conductor layer formed by an electrolytic plating film having a small thickness is larger than the minimum conductor circuit width in a conductor layer formed by an electrolytic plating film having a large thickness.

The minimum conductor circuit width existing in a conductor layer relates to the size of the mat surface of the metal foil forming the conductor layer. The minimum conductor circuit width in a conductor layer formed by a metal foil having a large unevenness is larger than the minimum conductor circuit width in a conductor layer formed by a metal foil having a small unevenness.

The minimum space width (minimum insulation distance) existing in a conductor layer relate to the thickness of the conductor layer. The minimum space width existing in a conductor layer having a large thickness is larger than the minimum space width existing in a conductor layer having a small thickness.

The minimum space width existing in a conductor layer relates to the thickness of the metal foil forming the conductor layer. The minimum space width in a conductor layer formed by a metal foil having a large thickness is larger than the minimum space width in a conductor layer formed by a metal foil having a small thickness.

The minimum space width existing in a conductor layer relates to the thickness of the electrolytic plating film forming the conductor layer. The minimum space width in a conductor layer formed by an electrolytic plating film having a small thickness is larger than the minimum space width in a conductor layer formed by an electrolytic plating film having a large thickness.

The minimum space width existing in a conductor layer relates to the size of the mat surface of the metal foil forming the conductor layer. The minimum space width in a conductor layer formed by a metal foil having a large unevenness is larger than the minimum space width in a conductor layer formed by a metal foil having a small unevenness.

An example of the printed wiring board 10 of the embodiment illustrated in FIG. 2A is described below.

The minimum inner side first conductor circuit width (Lsfm) is the smallest among the minimum inner side first conductor circuit width (Lsfm), the minimum first conductor circuit width (Ltfm), the minimum second conductor circuit width (Ltsm), the minimum outermost first conductor circuit width (Lufm) and the minimum outermost second conductor circuit width (Lusm). And, the minimum inner side third conductor circuit width (L3$fm$) is substantially equal to the minimum inner side first conductor circuit width (Lsfm). Or, the minimum inner side third conductor circuit width (L3$fm$) is substantially equal to the minimum outermost first conductor circuit width (Lufm).

The minimum inner side second conductor circuit width (Lssm) is the smallest among the minimum inner side second conductor circuit width (Lssm), the minimum first conductor circuit width (Ltfm), the minimum second conductor circuit width (Ltsm), the minimum outermost first conductor circuit width (Lufm) and the minimum outermost second conductor circuit width (Lusm). And, the minimum inner side fourth conductor circuit width (L4$sm$) is substantially equal to the minimum inner side second conductor circuit width (Lssm). Or, the minimum inner side fourth conductor circuit width (L4$sm$) is substantially equal to the minimum outermost second conductor circuit width (Lusm).

The minimum inner side first space width (Ssfm) is the smallest among the minimum inner side first space width (Ssfm), the minimum first space width (Stfm), the minimum second space width (Stsm), the minimum outermost first space width (Sufm) and the minimum outermost second space width (Susm). And, the minimum inner side third space width (S3$fm$) is substantially equal to the minimum inner side first space width (Ssfm). Or, the minimum inner side third space width (S3$fm$) is substantially equal to the minimum outermost first space width (Sufm).

The minimum inner side second space width (Sssm) is the smallest among the minimum inner side second space width (Sssm), the minimum first space width (Stfm), the minimum second space width (Stsm), the minimum outermost first space width (Sufm) and the minimum outermost second space width (Susm). And, the minimum inner side fourth space width (minimum insulation distance) (S4$sm$) is substantially equal to the minimum inner side second space width (Sssm). Or, the minimum inner side fourth space width (S4$sm$) is substantially equal to the minimum outermost second space width (Susm).

Therefore, fine conductor circuits can be formed in the inner side conductor layers in the first build-up layer (Bu1) and in the inner side conductor layers in the second build-up layer (Bu2). For example, wiring densities of the inner side first conductor layer (58F) and the inner side second conductor layer (58S) can be increased. The printed wiring board can be reduced in size. The printed wiring board can be reduced in thickness.

Manufacturing Method of Embodiment

A method for manufacturing the printed wiring board 10 of the embodiment is illustrated in FIG. 3A-7B.

A starting substrate (20z) illustrated in FIG. 3A is prepared. The starting substrate (20z) is formed by the core layer 20 having the first surface (F) and the second surface (S) on an opposite side with respect to the first surface (F), the first metal foil (tf) laminated on the first surface (F) of the core layer 20, and the second metal foil (ts) laminated on the second surface (S) of the core layer 20. The first metal foil (tf) has a first mat surface (32$tfm$) at an interface between the first surface (F) of the core layer 20 and the first metal foil (tf). A ten-point average roughness (Rz1) of an unevenness of the first mat surface (32$tfm$) is 3.5 μm or more and 5.0 μm or less. The second metal foil (ts) has a second mat surface (32$tsm$) at an interface between the second surface (S) of the core layer 20 and the second metal foil (ts). A ten-point average roughness (Rz2) of an unevenness of the second mat surface (32*tsm*) is 3.5 μm or more and 5.0 μm or less. A ten-point average roughness (Rz) of an unevenness of a mat surface of a metal foil forming a conductor layer having a large thickness is 3.5 μm or more and 5.0 μm or less. The core layer 20 is formed of a resin and a reinforcing material. The core layer 20 may have inorganic particles. Examples of the resin of the core layer 20 include an epoxy resin and a BT (bismaleimide triazine) resin. Examples of the reinforcing material of the core layer 20 include a glass cloth and an aramid fiber. Examples of the inorganic particles of the core layer 20 include silica particles and alumina particles.

As illustrated in FIG. 3B, CO2 laser is irradiated to the first metal foil (tf). The first openings (28F) are formed on the first surface (F) side of the core layer 20. The first openings (28F) are each tapered from the first surface (F) toward the second surface (S). Conditions of the laser are set such that the tapered shapes are formed. The conditions of the laser include the number of shots, a pulse width, an output, and the like. A diameter of a second shot can be set to be smaller than a diameter of a first shot.

As illustrated in FIG. 3C, CO2 laser is irradiated to the second metal foil (ts). The second openings (28S) are formed on the second surface (S) side of the core layer 20. The second openings (28S) are each tapered from the second surface (S) toward the first surface (F). Conditions of the laser are set such that the tapered shapes are formed. The conditions of the laser include the number of shots, a pulse width, an output, and the like. A diameter of a second shot can be set to be smaller than a diameter of a first shot. The through holes 28 are formed by the first openings (28F) and the second openings (28S). A joining area (28P) is formed at a joining place between a first opening and a second opening. An outer periphery of the joining area (28P) forms a neck part (28C).

Figure 3D:
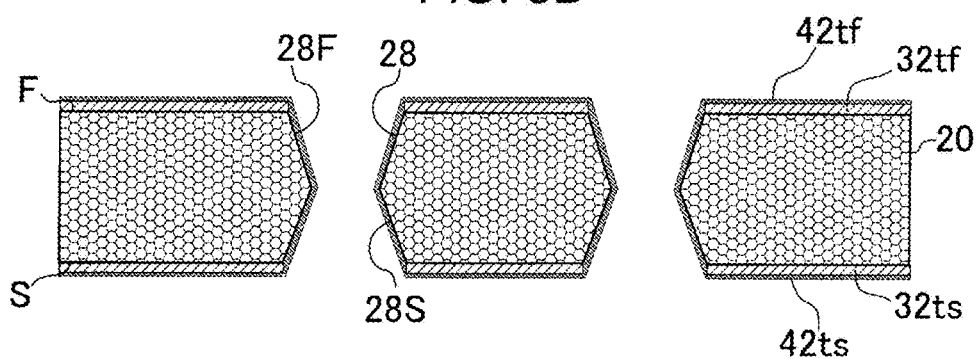
Figure 4A:
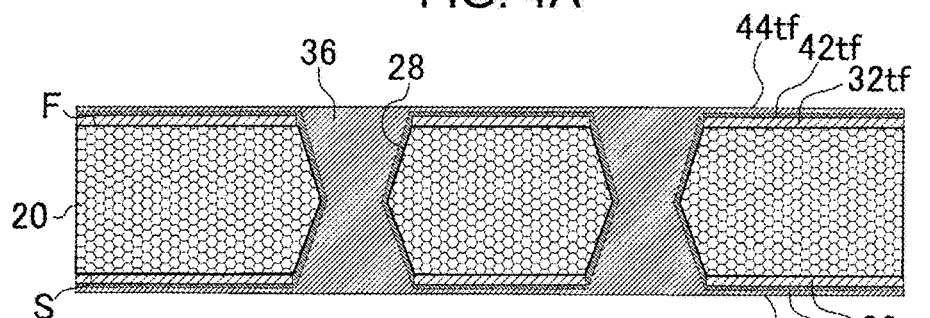
FIG. 4A-4D are manufacturing process diagrams of the printed wiring board of the embodiment.
Figure 4B:
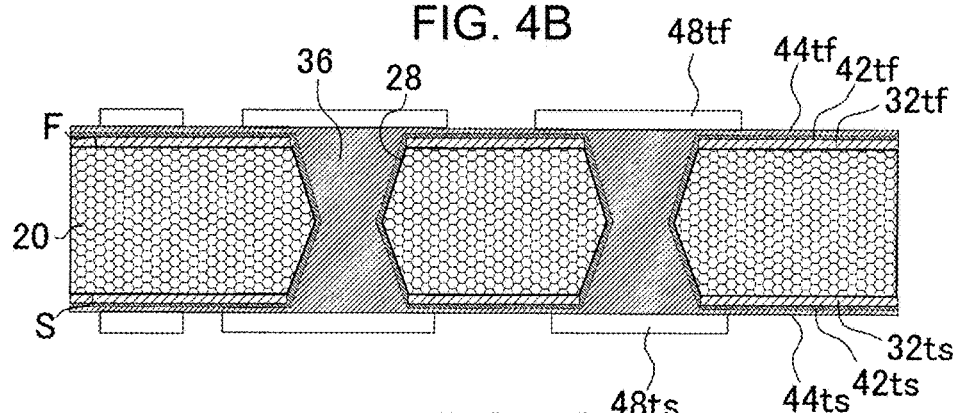
Figure 4C:
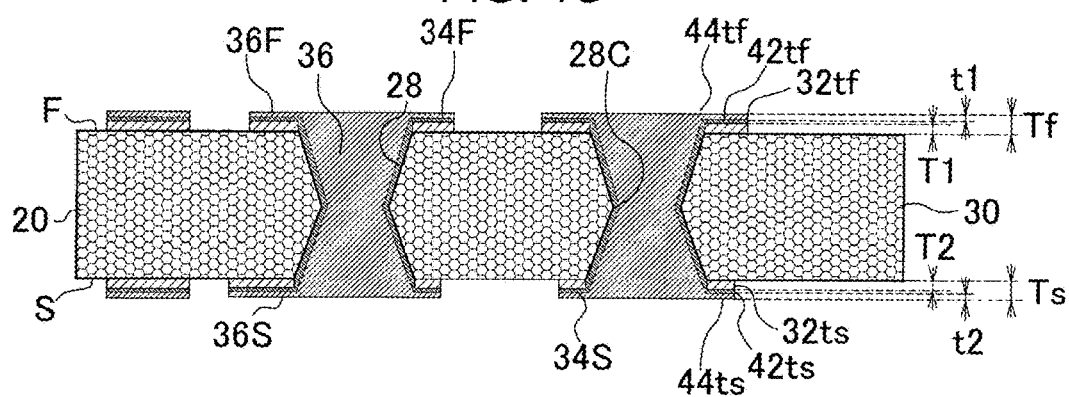

The first seed layer (42*tf*) and the second seed layer (42*ts*) are formed on the first metal foil (tf), the second metal foil (ts), and side walls of the through holes 28 by an electroless plating treatment (FIG. 3D). The first electrolytic plating film (44*tf*) is formed using the first seed layer (42*tf*), and the second electrolytic plating film (44*ts*) is formed using the second seed layer (42*ts*) (FIG. 4A). The first seed layer (42*tf*) and the second seed layer (42*ts*) are simultaneously formed. A first etching resist (48*tf*) is formed on the first electrolytic plating film (44*tf*). A second etching resist (48*ts*) is formed on the second electrolytic plating film (44*ts*) (FIG. 4B). The first etching resist (48*tf*) and the second etching resist (48*ts*) are simultaneously formed. The first electrolytic plating film (44*tf*), the first seed layer (42*tf*) and the first metal foil (tf) exposed from the first etching resist are removed by etching. The second electrolytic plating film (44*ts*), the second seed layer (42*ts*) and the second metal foil (ts) exposed from the second etching resist are removed by etching. These are simultaneously removed. The etching resists are removed, and the core substrate 30 is completed (FIG. 4C). The through-hole conductors 36 are respectively formed in the through holes 28. Simultaneously, the first conductor layer (34F) including the first through-hole lands (36F) and the second conductor layer (34S) including the second through-hole lands (36S) are formed. The first conductor layer (34F) and the second conductor layer (34S) are formed using a subtractive method.

In the embodiment, the joining area (28P) and the neck part (28C) are formed at a substantially central portion of each of the through holes 28. Therefore, when the through-hole conductors 36 are formed by plating, voids are unlikely to be generated in the through-hole conductors 36. Reliability of the through-hole conductors 36 is high. The first conductor layer (34F) includes the first metal foil (tf), the first seed layer (42*tf*) formed on the first metal foil (tf), and the first electrolytic plating film (44*tf*) formed on the first seed layer (42*tf*). The second conductor layer (34S) includes the second metal foil (ts), the second seed layer (42*ts*) formed on the second metal foil (ts), and the second electrolytic plating film (44*ts*) formed on the second seed layer (42*ts*). The thickness (Tf) of the first conductor layer (34F) is 15 μm or more and 35 μm or less, the thickness (Ts) of the second conductor layer (34S) is 15 μm or more and 35 μm or less, the thickness (T1) of the first metal foil (tf) forming the first conductor layer (34F) is 2 μm or more and 15 μm or less, and the thickness (T2) of the second metal foil (ts) forming the second conductor layer (34S) is 2 μm or more and 15 μm or less. The thickness (t1) of the first electrolytic plating film (44*tf*) forming the first conductor layer (34F) is 1 μm or more and 12 μm or less, and the thickness (t2) of the second electrolytic plating film (44*ts*) forming the second conductor layer (34S) is 1 μm or more and 12 μm or less.

Figure 4D:
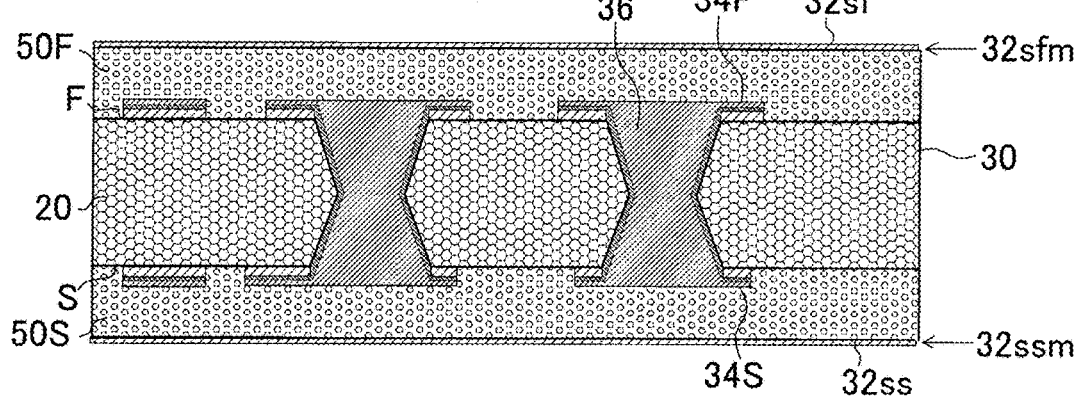
Figure 5A:
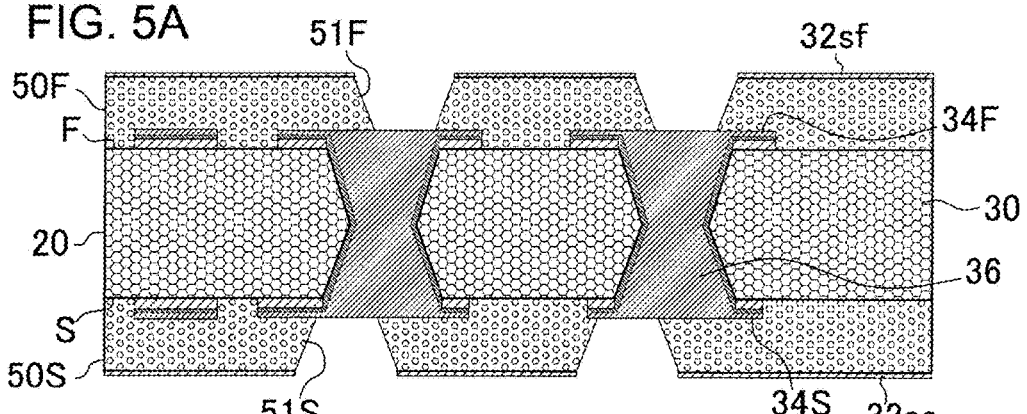
FIG. 5A-5D are manufacturing process diagrams of the printed wiring board of the embodiment.

The first resin insulating layer (50F) and the inner side first metal foil (32*sf*) are sequentially laminated on the first surface (F) of the core substrate 30 and on the first conductor layer (34F). The second resin insulating layer (50S) and the inner side second metal foil (32*ss*) are sequentially laminated on the second surface (S) and on the second conductor layer (34S) (FIG. 4D). The inner side first metal foil (32*sf*) has an inner side first mat surface (32*sfm*) at an interface between the first resin insulating layer (50F) and the inner side first metal foil (32*sf*). A ten-point average roughness (RzI1) of an unevenness of the inner side first mat surface (32*sfm*) is 1.5 μm or more and 2.5 μm or less. The inner side second metal foil (32*ss*) has an inner side second mat surface (32*ssm*) at an interface between the second resin insulating layer (50S) and the inner side second metal foil (32*ss*). A ten-point average roughness (RzI2) of an unevenness of the inner side second mat surface (32*ssm*) is 1.5 μm or more and 2.5 μm or less. The first resin insulating layer (50F) and the second resin insulating layer (50S) are each formed of a reinforcing material such as a glass cloth, inorganic particles such as silica particles, and a resin such as an epoxy resin. Using CO2 gas laser, openings (51F) penetrating the first resin insulating layer (50F) and the inner side first metal foil (32*sf*) and reaching the first conductor layer (34F) are formed, and openings (51S) penetrating the second resin insulating layer (50S) and the inner side second metal foil (32*ss*) and reaching the second conductor layer (34S) are formed (FIG. 5A). The inner side conductor layers each having a small thickness are formed by the inner side first metal foil (32*sf*) and the inner side second metal foil (32*ss*) in FIG. 4D.

Figure 5B:
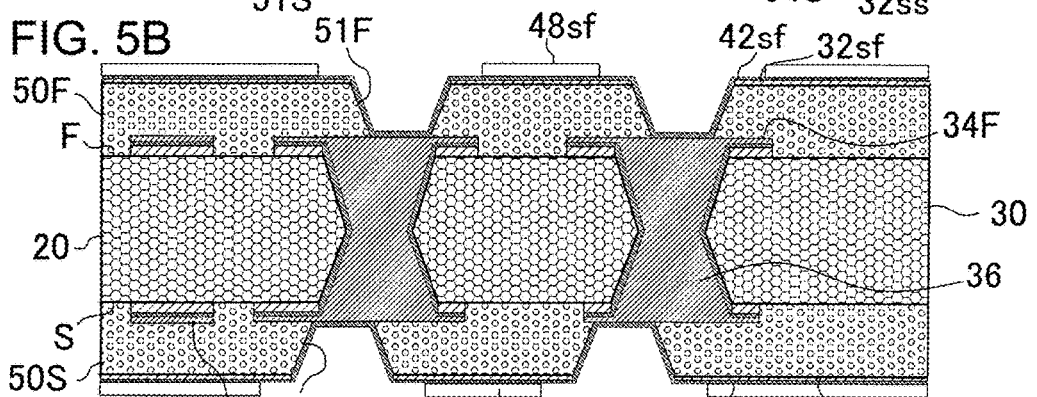
Figure 5C:
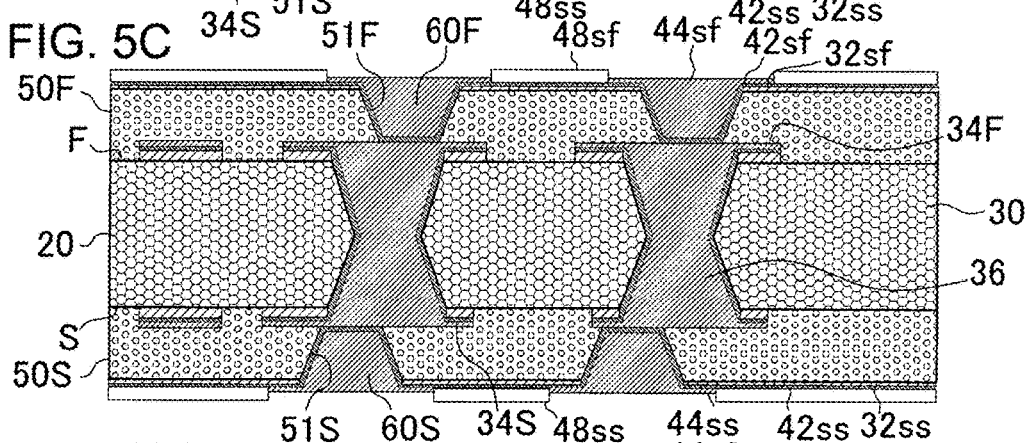

The inner side first seed layer (42*sf*) is formed on the inner side first metal foil (32*sf*) and on inner walls of the openings (51F). The inner side second seed layer (42*ss*) is formed on the inner side second metal foil (32*ss*) and on inner walls of the openings (51S). A plating resist (48*sf*) is formed on the inner side first seed layer (42*sf*), and a plating resist (48*ss*) is formed on the inner side second seed layer (42*ss*) (FIG. 5B). The inner side first electrolytic plating film (44*sf*) is formed on the inner side first seed layer (42*sf*) exposed from the plating resist (48*sf*). The inner side second electrolytic plating film (44*ss*) is formed on the inner side second seed layer (42*ss*) exposed from the plating resist (48*ss*). In this case, the openings (51F) are filled with the inner side first electrolytic plating film (44*sf*). The openings (51S) are filled with the inner side second electrolytic plating film (44*ss*). The first via conductors (60F) connecting to the first conductor layer (34F) are respectively formed in the openings (51F). The second via conductors (60S) connecting to the second conductor layer (34S) are respectively formed in the openings (51S) (FIG. 5C). The first via conductors (60F) are mainly formed by the first electrolytic plating film (44sf). The second via conductors (60S) are mainly formed by the second electrolytic plating film (44ss). The plating resists (48sf, 48ss) are removed.

Figure 5D:
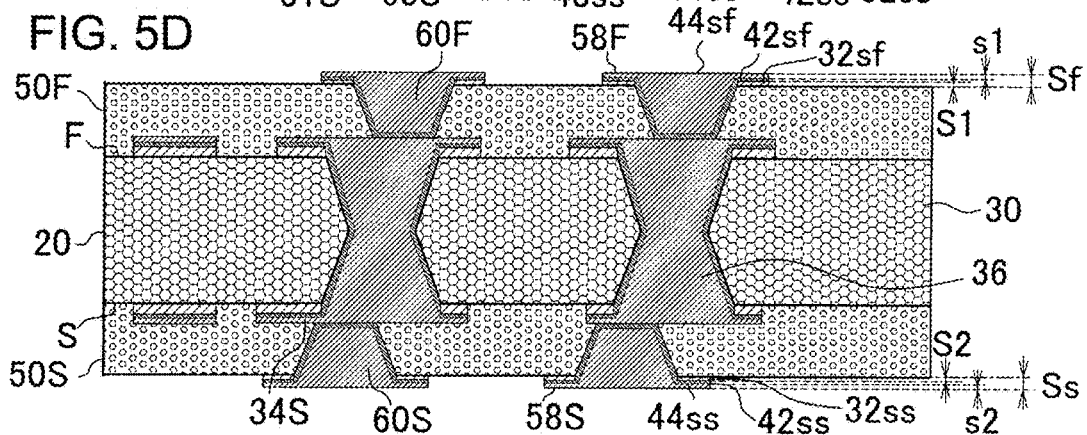

The inner side first seed layer (42sf) and the inner side first metal foil (32sf) exposed from the inner side first electrolytic plating film (44sf) are removed. The inner side second seed layer (42ss) and the inner side second metal foil (32ss) exposed from the inner side second electrolytic plating film (44ss) are removed. The inner side first conductor layer (58F) and the inner side second conductor layer (58S) are each formed by an MSAP (Modified Semi Additive Process) (FIG. 5D). The inner side first conductor layer (58F) includes the inner side first metal foil (32sf), the inner side first seed layer (42sf) on the inner side first metal foil (32sf), and the inner side first electrolytic plating film (44sf) on the inner side first seed layer (42sf). The inner side second conductor layer (58S) includes the inner side second metal foil (32ss), the inner side second seed layer (42ss) on the inner side second metal foil (32ss), and the inner side second electrolytic plating film (44ss) on the inner side second seed layer (42ss). The thickness (Sf) of the inner side first conductor layer (58F) is 5 μm or more and 25 μm or less, and the thickness (Ss) of the inner side second conductor layer (58S) is 5 μm or more and 25 μm or less. The thickness (S1) of the inner side first metal foil (32sf) is 2 μm or more and 5 μm or less, and the thickness (s1) of the inner side first electrolytic plating film (44sf) is 5 μm or more and 25 μm or less. The thickness (S2) of the inner side second metal foil (32ss) is 2 μm or more and 5 μm or less, and the thickness (s2) of the inner side second electrolytic plating film (44ss) is 5 μm or more and 25 μm or less.

The processes of FIG. 4D-5D are repeated.

The third resin insulating layer (150F) and the inner side third metal foil (32gf) are sequentially formed on the first resin insulating layer (50F) and the inner side first conductor layer (58F).

The fourth resin insulating layer (150S) and the inner side fourth metal foil (32gs) are sequentially formed on the second resin insulating layer (50S) and the inner side second conductor layer (58S).

The inner side third conductor layer (158F) is formed on the third resin insulating layer (150F) by an MSAP. At the same time, the third via conductors (160F) are formed penetrating the third resin insulating layer (150F) and connecting the inner side first conductor layer (58F) and the inner side third conductor layer (158F) to each other. The inner side third conductor layer (158F) includes the inner side third metal foil (32gf), the inner side third seed layer (42gf) on the inner side third metal foil (32gf), and the inner side third electrolytic plating film (44gf) on the inner side third seed layer (42gf). The third via conductors (160F) are mainly formed by the inner side third electrolytic plating film (44gf).

The inner side third metal foil (32gf) has an inner side third mat surface (32gfm) at an interface between the third resin insulating layer (150F) and the inner side third metal foil (32gf). A ten-point average roughness (RzUI1) of an unevenness of the third mat surface (32gfm) is 1.5 μM or more and 2.5 μm or less.

The thickness (Gf) of the inner side third conductor layer (158F) is 5 μm or more and 25 μm or less. A thickness (G1) of the third metal foil (32gf) forming the inner side third conductor layer (158F) is 2 μm or more and 5 μm or less, the thickness (g1) of the inner side third electrolytic plating film (44gf) is 5 μm or more and 25 μm or less.

Figure 6A:
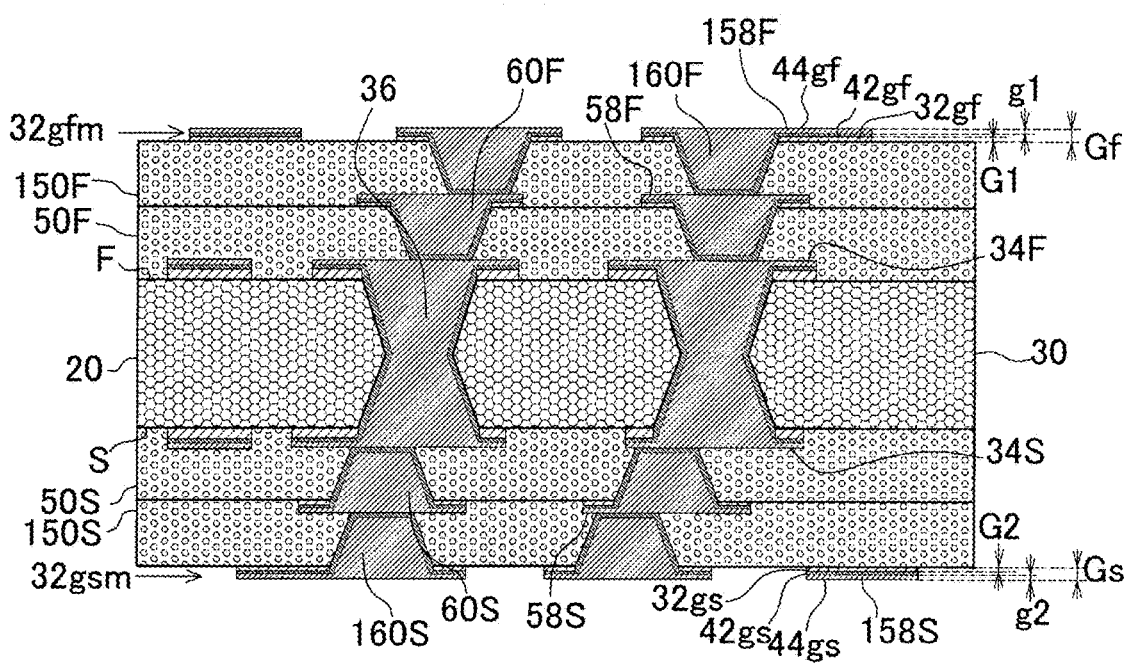
FIGS. 6A and 6B are manufacturing process diagrams of the printed wiring board of the embodiment.

The inner side fourth conductor layer (158S) is formed on the fourth resin insulating layer (150S) by an MSAP. At the same time, the fourth via conductors (160S) are formed penetrating the fourth resin insulating layer (150S) and connecting the inner side second conductor layer (58S) and the inner side fourth conductor layer (158S) to each other (FIG. 6A). The inner side fourth conductor layer (158S) includes the inner side fourth metal foil (32gs), the inner side fourth seed layer (42gs) on the inner side fourth metal foil (32gs), and the inner side fourth electrolytic plating film (44gs) on the inner side fourth seed layer (42gs). The fourth via conductors (160S) are mainly formed by the inner side fourth electrolytic plating film (44gs).

The inner side fourth metal foil (32gs) has a fourth mat surface (32gsm) at an interface between the fourth resin insulating layer (150S) and the inner side fourth metal foil (32gs). A ten-point average roughness (RzUI2) of an unevenness of the fourth mat surface (32gsm) is 1.5 μm or more and 2.5 μm or less.

The thickness (Gs) of the inner side fourth conductor layer (158S) is 5 μM or more and 25 μm or less. A thickness (G2) of the inner side fourth metal foil (32gs) forming the inner side fourth conductor layer (158S) is 2 μm or more and 5 μm or less, and the thickness (g2) of the inner side fourth electrolytic plating film (44gs) is 5 μm or more and 25 μm or less.

The outermost first resin insulating layer (250F) and the outermost first metal foil (32uf) are sequentially laminated on the third resin insulating layer (150F) and the inner side third conductor layer (158F). The outermost first metal foil (32uf) has an outermost first mat surface (32ufm) at an interface between the outermost first resin insulating layer (250F) and the outermost first metal foil (32uf). A ten-point average roughness (RzO1) of an unevenness of the outermost first mat surface (32ufm) is 3.5 μm or more and 5.0 μm or less.

The outermost second resin insulating layer (250S) and the outermost second metal foil (32us) are sequentially laminated on the fourth resin insulating layer (150S) and the inner side fourth conductor layer (158S). The outermost second metal foil (32us) has an outermost second mat surface (32usm) at an interface between the outermost second resin insulating layer (250S) and the outermost second metal foil (32us). A ten-point average roughness (RzO2) of an unevenness of the outermost second mat surface (32usm) is 3.5 μm or more and 5.0 μm or less.

CO2 gas laser is irradiated to the outermost first metal foil (32uf). Openings (251F) are formed penetrating the outermost first metal foil (32uf) and the outermost first resin insulating layer (250F) and reaching the inner side third conductor layer (158F).

Figure 6B:
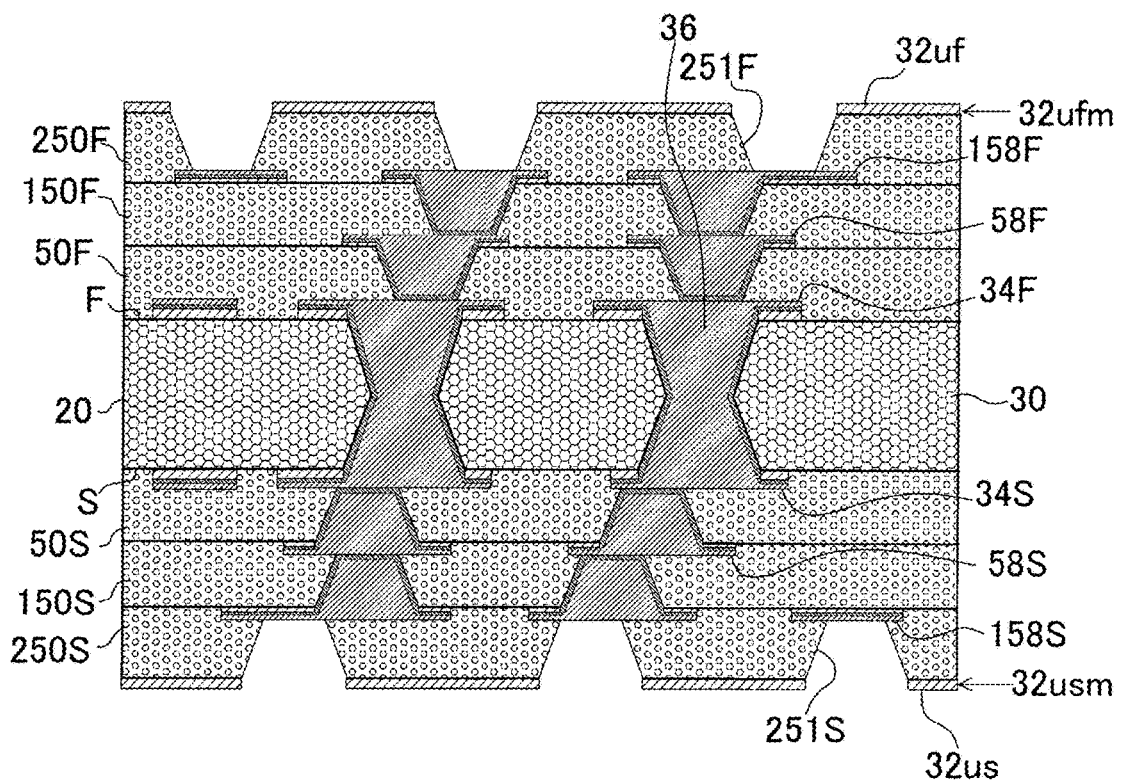

CO2 gas laser is irradiated to the outermost second metal foil (32us). Openings (251S) are formed penetrating the outermost second metal foil (32us) and the outermost second resin insulating layer (250S) and reaching the inner side fourth conductor layer (158S) (FIG. 6B).

Figure 7A:
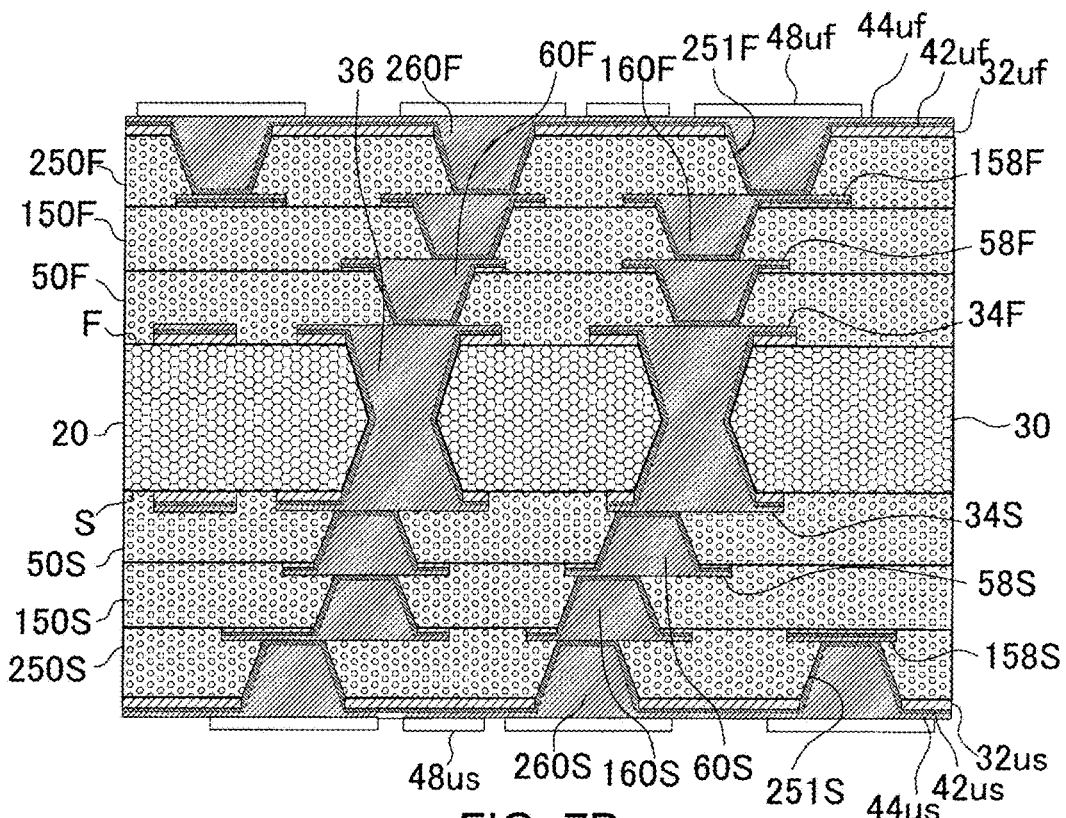
FIGS. 7A and 7B are manufacturing process diagrams of the printed wiring board of the embodiment.
Figure 7B:
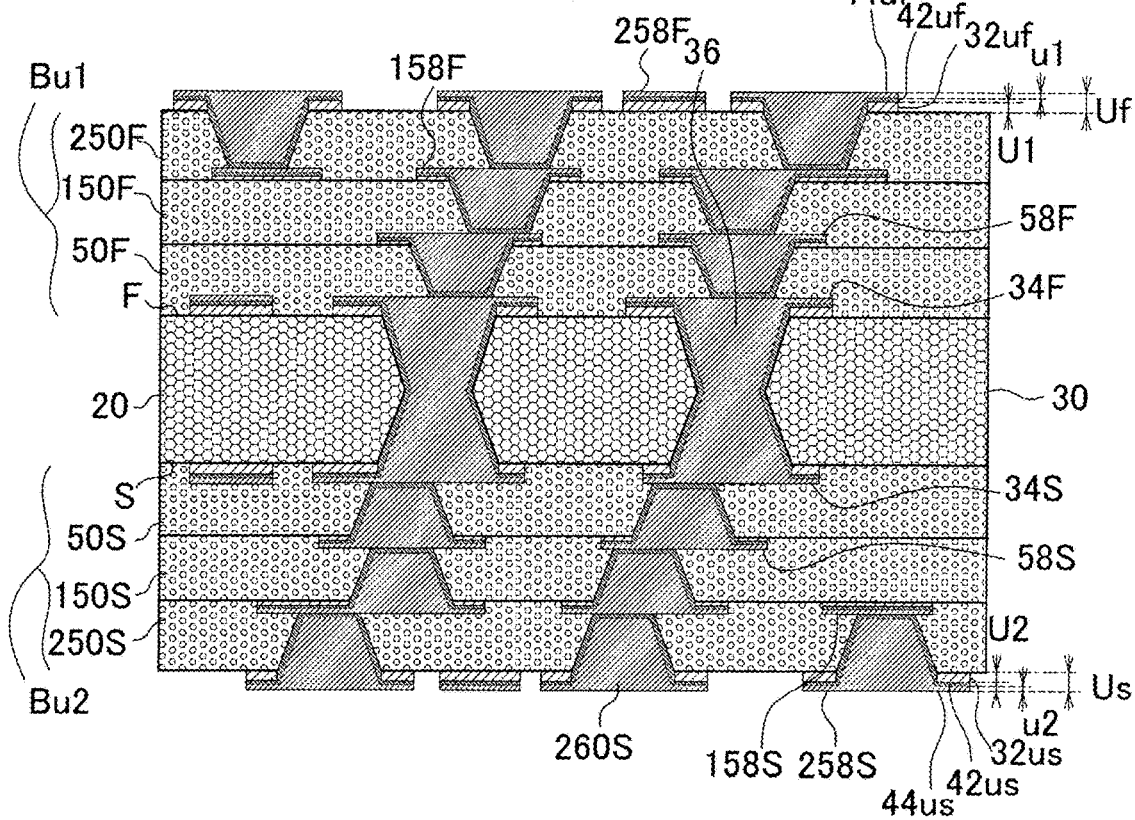

By an electroless plating treatment, the outermost first seed layer (42uf) is formed on the outermost first metal foil (32uf) and on inner walls of the openings (251F). The outermost second seed layer (42us) is formed on the outermost second metal foil (32us) and on inner walls of the openings (251S). By an electrolytic plating treatment, the outermost first electrolytic plating film (44uf) is formed on the outermost first seed layer (42uf). At the same time, the outermost first via conductors (260F) are respectively formed in the openings (251F). The outermost first via conductors (260F) are mainly formed by the outermost first electrolytic plating film (44uf). At the same time, the outermost second electrolytic plating film (44us) is formed on the outermost second seed layer (42us). The outermost second via conductors (260S) are respectively formed in the openings (251S). The outermost second via conductors (260S) are mainly formed by the outermost second electrolytic plating film (44us). An etching resist (48uf) is formed on the outermost first electrolytic plating film (44uf). An etching resist (48us) is formed on the outermost second electrolytic plating film (44us) (FIG. 7A). The outermost first electrolytic plating film (44uf), the outermost first seed layer (42uf) and the outermost first metal foil (32uf) exposed from the etching resist (48uf) are removed by etching. The outermost first conductor layer (258F) is formed using a subtractive method. The outermost second electrolytic plating film (44us), the outermost second seed layer (42us) and the outermost second metal foil (32us) exposed from the etching resist (48us) are removed by etching. The outermost second conductor layer (258S) is formed using a subtractive method (FIG. 7B). The first build-up layer (Bu1) is formed on the first surface (F) of the core substrate 30, and the second build-up layer (Bu2) is formed on the second surface (S) of the core substrate 30.

The outermost first conductor layer (258F) includes the outermost first metal foil (32uf), the outermost first seed layer (42uf) on the outermost first metal foil (32uf), and the outermost first electrolytic plating film (44uf) on the outermost first seed layer (42uf). The outermost second conductor layer (258S) includes the outermost second metal foil (32us), the outermost second seed layer (42us) on the outermost second metal foil (32us), and the outermost second electrolytic plating film (44us) on the outermost second seed layer (42us).

The thickness (Uf) of the outermost first conductor layer (258F) is 15 μm or more and 35 μm or less. The thickness (U1) of the outermost first metal foil (32u1) forming the outermost first conductor layer (258F) is 2 μm or more and 15 μm or less, and the thickness (u1) of the outermost first electrolytic plating film (44uf) is 1 μm or more and 12 μm or less.

The thickness (Us) of the outermost second conductor layer (258S) is 15 μm or more and 35 μm or less. The thickness (U2) of the outermost second metal foil (32us) forming the outermost second conductor layer (258S) is 2 μm or more and 15 μm or less, and the thickness (u2) of the outermost second electrolytic plating film (44us) is 1 μm or more and 12 μm or less.

Figure 1B:
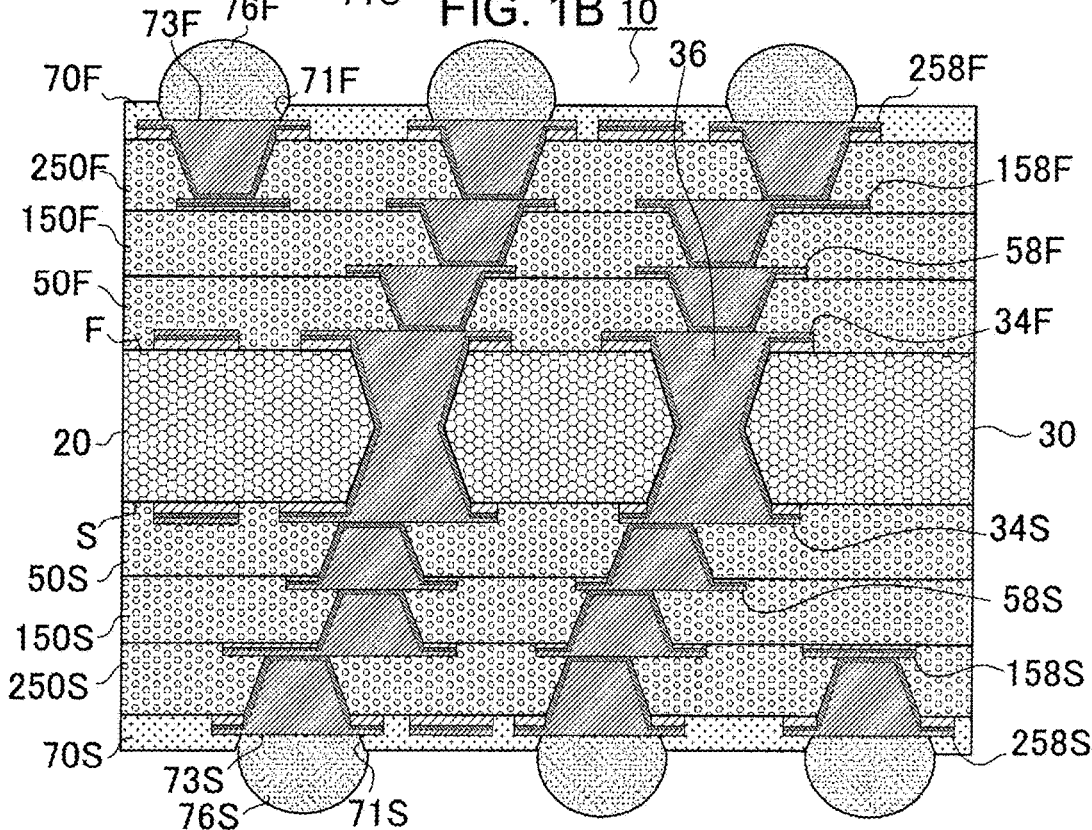

The first solder resist layer (70F) having the first openings (71F) exposing the first pads (73F) included in the outermost first conductor layer (258F) is formed on the first build-up layer (Bu1). The second solder resist layer (70S) having the second openings (71S) exposing the second pads (73S) included in the outermost second conductor layer (258S) is formed on the second build-up layer (Bu2) (FIG. 1A). First solder bumps (76F) are respectively formed by reflow on the first pads (73F) exposed from the first openings (71F). Second solder bumps (76S) are respectively formed by reflow on the second pads (73S) exposed from the second openings (71S). The printed wiring board 10 having the solder bumps is completed (FIG. 1B).

The conductor layers (the first conductor layer (34F) and the second conductor layer (34S)) of the core substrate and the outermost conductor layers (the outermost first conductor layer (258F) and the outermost second conductor layer (258S)) belong to the conductor layers each having a large thickness. The inner side conductor layers are classified into conductor layers each having a large thickness and conductor layers each having a small thickness. The thicknesses of the conductor layers belonging to the conductor layers each having a large thickness are substantially equal to each other. The thicknesses of the conductor layers belonging to the conductor layers each having a small thickness are substantially equal to each other. The thickness of a conductor layer having a large thickness is larger than the thickness of a conductor layer having a small thickness.

A ratio (RTT) ((a thickness of a conductor layer having a large thickness)/(a thickness of a conductor layer having a small thickness)) of a thickness of a conductor layer having a large thickness to a thickness of a conductor layer having a small thickness is preferably 1.2 or more and 3 or less. When the ratio (RTT) is greater than 1 and less than 1.2, the adhesion strength cannot be significantly improved. When the ratio (RTT) exceeds 3, the change in the adhesion strength becomes small.

For example, when the ratio (RTT) is less than 1.2, the thicknesses of the two conductor layers being compared to each other are substantially equal to each other. For example, when the ratio (RTT) exceeds 1.2, the two conductor layers being compared to each other are classified into a conductor layer having a small thickness and a conductor layer having a large thickness.

A thickness of a conductor layer and a thickness of a metal foil forming the conductor layer are related to each other. A conductor layer having a large thickness is formed by a metal foil having a large thickness, and a conductor layer having a small thickness is formed by a metal foil having a small thickness. A thickness of a metal foil having a large thickness is larger than a thickness of a metal foil having a small thickness. A ratio ((a thickness of a metal foil having a large thickness)/(a thickness of a metal foil having a small thickness)) of a thickness of a metal foil having a large thickness to a thickness of a metal foil having a small thickness is preferably 1.2 or more.

A thickness of a conductor layer and a thickness of an electrolytic plating film forming the conductor layer are related to each other. A conductor layer having a large thickness is formed by an electrolytic plating film having a small thickness, and a conductor layer having a small thickness is formed by an electrolytic plating film having a large thickness. A thickness of an electrolytic plating film having a large thickness is larger than a thickness of an electrolytic plating film having a small thickness. A ratio ((a thickness of an electrolytic plating film having a large thickness)/(a thickness of an electrolytic plating film having a small thickness)) of a thickness of an electrolytic plating film having a large thickness to a thickness of an electrolytic plating film having a small thickness is preferably 1.2 or more.

A thickness of a conductor layer and a size of an unevenness of a mat surface of a metal foil forming the conductor layer are related to each other. A conductor layer having a large thickness is formed by a metal foil having a large unevenness, and a conductor layer having a small thickness is formed by a metal foil having a small unevenness. A size of an unevenness is represented, for example, by a ten-point average roughness. A size of a large unevenness is larger than a size of a small unevenness. A ratio ((a size of a large unevenness)/(a size of a small unevenness)) of a size of a large unevenness to a size of a small unevenness is preferably 1.2 or more.

In the printed wiring board 10 of the embodiment, the conductor layers of the core substrate and the outermost conductor layers belong to the conductor layers each having a large thickness. An inner side conductor layer belongs to either a conductor layer having a large thickness or a conductor layer having a small thickness. The thickness of an inner side conductor layer having a large thickness is substantially equal to the thickness of a conductor layer of the core substrate.

A thickness of a metal foil forming a conductor layer and a thickness of an electrolytic plating film forming the conductor layer are related to each other. When the thickness of the metal foil is large, the thickness of the electrolytic plating film is small. Therefore, for a conductor layer having a small thickness, a ratio ((the thickness of the metal foil)/(the thickness of the electrolytic plating film)) of the thickness of the metal foil to the thickness of the electrolytic plating film is smaller than 1. Conversely, for a conductor layer having a large thickness, the ratio ((the thickness of the metal foil)/(the thickness of the electrolytic plating film)) is larger than 1.

The thicknesses of the conductor layers (34F, 34S) forming the core substrate 30 are 15 µm or more and 35 µm or less. The thicknesses of the metal foils forming the conductor layers of the core substrate are 2 µm or more and 15 µm or less. The thicknesses of the electrolytic plating films forming the conductor layers of the core substrate are 1 µm or more and 12 µm or less. The ten-point average roughnesses (Rz) of the unevennesses of the mat surfaces of the metal foils forming the conductor layers of the core substrate are 3.0 µm or more and 5.0 µm or less.

The thicknesses of the outermost conductor layers (258F, 258S) are 15 µm or more and 35 µm or less. The thicknesses of the metal foils forming the outermost conductor layers are 2 µm or more and 15 µm or less. The thicknesses of the electrolytic plating films forming the outermost conductor layers are 1 µm or more and 12 µm or less. The ten-point average roughnesses (Rz) of the unevennesses of the mat surfaces of the metal foils forming the outermost conductor layers are 3.0 µm or more and 5.0 µm or less. The thicknesses of the metal foils forming the outermost conductor layers can be made smaller than the thicknesses of the metal foils forming the conductor layers of the core substrate. The ten-point average roughnesses of the unevennesses of the mat surfaces of the metal foils forming the outermost conductor layers can be made smaller than the ten-point average roughnesses of the unevennesses of the mat surfaces of the metal foils forming the conductor layers of the core substrate.

An example of an inner side conductor layer having a small thickness is described below.

A thickness of an inner side conductor layer having a small thickness is 5 µm or more and 25 µm or less. A thickness of a metal foil forming an inner side conductor layer having a small thickness is 2 µm or more and 5 µm or less. A thickness of an electrolytic plating film forming an inner side conductor layer having a small thickness is 5 µm or more and 25 µm or less. A ten-point average roughness (Rz) of an unevenness of a mat surface of a metal foil forming an inner side conductor layer having a small thickness is 1.5 µm or more and 2.5 µm or less.

An example of an inner side conductor layer having a large thickness is described below.

A thickness of an inner side conductor layer having a large thickness is 15 µm or more and 35 µm or less. A thickness of a metal foil forming an inner side conductor layer having a large thickness is 2 µm or more and 15 µm or less. A thickness of an electrolytic plating film forming an inner side conductor layer having a large thickness is 1 µm or more and 12 µm or less. A ten-point average roughness (Rz) of an unevenness of a mat surface of a metal foil forming an inner side conductor layer having a large thickness is 3.0 µm or more and 5.0 µm or less. A conductor layer having a large thickness can have the ranges of values described in this paragraph.

Japanese Patent Laid-Open Publication No. 2012-156525 describes a multilayer printed wiring board in FIG. 2A. In the printed wiring board, insulating layers and conductor layers are alternately laminated, and adjacent conductor layers are connected to each other by via holes formed in the insulating layers. Further, Japanese Patent Laid-Open Publication No. 2012-156525 describes a method for manufacturing the multilayer printed wiring board in FIG. 9A-9E, 10A-10E, 11, and 12A-12B. According to FIG. 9B of Japanese Patent Laid-Open Publication No. 2012-156525, openings for via hole formation reaching a copper foil are formed in an insulating layer. Thereafter, the via holes are respectively formed in the openings. Thereafter, as illustrated in FIG. 9E, conductor layers are formed on both sides of the insulating layer. Then, by alternately laminating insulating layers and conductor layers on both sides of the circuit substrate of FIG. 9E, the multilayer printed wiring board illustrated in FIG. 12A of Japanese Patent Laid-Open Publication No. 2012-156525 is manufactured.

According to the manufacturing method illustrated in FIG. 9A-9E, 10A-10E, 11, and 12A-12B, in Japanese Patent Laid-Open Publication No. 2012-156525, the circuit substrate of FIG. 9E is thought to be a core substrate. Then, the core substrate has the via holes reaching the copper foil. For example, when the multilayer printed wiring board illustrated in FIG. 12A of Japanese Patent Laid-Open Publication No. 2012-156525 is subjected to a stress due to heat cycles, the circuit substrate (core substrate) illustrated in FIG. 9E is thought to be subjected to a large stress. In particular, a stress acting on interfaces between bottom surfaces of the via holes formed in the circuit substrate (core substrate) illustrated in FIG. 9E of Japanese Patent Laid-Open Publication No. 2012-156525 and the copper foil (conductor circuits) in contact with the bottom surfaces is thought to be large. Due to the stress, connection reliability between the bottom surfaces of the via holes in the circuit substrate (core substrate) illustrated in FIG. 9E and the copper foil (conductor circuits) is expected to decrease.

A printed wiring board according to an embodiment of the present invention includes: a core substrate having a core layer having a first surface and a second surface on an opposite side with respect to the first surface, a first conductor layer on the first surface of the core layer, a second conductor layer on the second surface of the core layer, and through-hole conductors penetrating the core layer and connecting the first conductor layer and the second conductor layer to each other; a first resin insulating layer formed on the first surface and the first conductor layer; a second resin insulating layer formed on the second surface and the second conductor layer; an inner side first conductor layer formed on the first resin insulating layer; an inner side second conductor layer formed on the second resin insulating layer; first via conductors penetrating the first resin insulating layer and electrically connecting the first conductor layer and the inner side first conductor layer to each other; second via conductors penetrating the second resin insulating layer and electrically connecting the second conductor layer and the inner side second conductor layer to each other; an outermost first resin insulating layer formed on the first resin insulating layer and the inner side first conductor layer; an outermost second resin insulating layer formed on the second resin insulating layer and the inner side second conductor layer; an outermost first conductor layer formed on the outermost first resin insulating layer; an outermost second conductor layer formed on the outermost second resin insulating layer; outermost first via conductors penetrating the outermost first resin insulating layer and electrically connecting the inner side first conductor layer and the outermost first conductor layer to each other; and outermost second via conductors penetrating the outermost second resin insulating layer and electrically connecting the inner side second conductor layer and the outermost second conductor layer to each other. The first conductor layer is formed by a first metal foil, a first seed layer on the first metal foil, and a first electrolytic plating film on the first seed layer. The second conductor layer is formed by a second metal foil, a second seed layer on the second metal foil, and a second electrolytic plating film on the second seed layer. The inner side first conductor layer is formed by an inner side first metal foil, an inner side first seed layer on the inner side first metal foil, and an inner side first electrolytic plating film on the inner side first seed layer. The inner side second conductor layer is formed by an inner side second metal foil, an inner side second seed layer on the inner side second metal foil, and an inner side second electrolytic plating film on the inner side second seed layer. The outermost first conductor layer is formed by an outermost first metal foil, an outermost first seed layer on the outermost first metal foil, and an outermost first electrolytic plating film on the outermost first seed layer. The outermost second conductor layer is formed by an outermost second metal foil, an outermost second seed layer on the outermost second metal foil, and an outermost second electrolytic plating film on the outermost second seed layer. The first via conductors are formed by the inner side first electrolytic plating film. The second via conductors are formed by the inner side second electrolytic plating film. The outermost first via conductors are formed by the outermost first electrolytic plating film. The outermost second via conductors are formed by the outermost second electrolytic plating film. The first metal foil has a thickness (T1). The second metal foil has a thickness (T2). The inner side first metal foil has a thickness (S1). The inner side second metal foil has a thickness (S2). The outermost first metal foil has a thickness (U1). The outermost second metal foil has a thickness (U2). The first electrolytic plating film has a thickness (t1). The second electrolytic plating film has a thickness (t2). The inner side first electrolytic plating film has a thickness (s1). The inner side second electrolytic plating film has a thickness (s2). The outermost first electrolytic plating film has a thickness (u1). The outermost second electrolytic plating film has a thickness (u2). A ratio (t1/T1) of the thickness (t1) to the thickness (T1) is smaller than 1. A ratio (t2/T2) of the thickness (t2) to the thickness (T2) is smaller than 1. A ratio (u1/U1) of the thickness (u1) to the thickness (U1) is smaller than 1. A ratio (u2/U2) of the thickness (u2) to the thickness (U2) is smaller than 1. A ratio (s1/S1) of the thickness (S1) to the thickness (S1) is larger than 1. A ratio (s2/S2) of the thickness (s2) to the thickness (S2) is larger than 1.

According to an embodiment of the present invention, for each of the first conductor layer, the second conductor layer, the outermost first conductor layer and the outermost second conductor layer, the thickness of the metal foil forming the conductor layer is larger than the thickness of the electrolytic plating film forming the conductor layer. Therefore, variation in the thickness of each of these conductor layers can be reduced. The thickness of each of these conductor layers can be made uniform. This is because variation in the thickness of the metal foil is smaller than variation in the thickness of the electrolytic plating film. Since variation in the thickness of each of the outermost conductor layers is small, for example, flatness of a surface on which an electronic component is mounted or flatness of a surface for connecting to another circuit substrate can be increased. Therefore, connection reliability between the printed wiring board of the embodiment and the electronic component or connection reliability between the printed wiring board of the embodiment and the other circuit substrate can be increased.

Further, the variation in the thickness of the first conductor layer forming the core substrate and the variation in the thickness of the second conductor layer can be reduced. For example, flatness of the core substrate can be increased. In the printed wiring board of the embodiment, since the build-up layers are laminated on the core substrate, by increasing the flatness of the core substrate, for example, the flatness of the surface on which an electronic component is mounted or the flatness of the surface for connecting to another circuit substrate can be increased.

Then, for each of the inner side conductor layers, the thickness of the electrolytic plating film is larger than the thickness of the metal foil. Therefore, flatness of upper surfaces of the first via conductors and the second via conductors can be increased. This is because the first via conductors and the second via conductors are mainly formed by the electrolytic plating films. When the thickness of the electrolytic plating film is small, the openings of the via conductors are difficult to be filled. However, in the embodiment, since the thickness of the electrolytic plating film is large, the openings of the via conductors can be filled. When the upper surfaces of the via conductors are flat, via conductors can be formed directly on via conductors. A high density printed wiring board can be provided. Further, since the number of the resin insulating layers and the number of the conductor layers can be reduced, warpage of the printed wiring board can be reduced. A stress acting on the through-hole conductors of the core substrate can be reduced.

Obviously, numerous modifications and variations of the present invention are possible in light of the above teachings. It is therefore to be understood that within the scope of the appended claims, the invention may be practiced otherwise than as specifically described herein.

What is claimed is:
1. A printed wiring board, comprising:
a core substrate comprising a core layer, a first conductor layer formed on a first surface of the core layer, a second conductor layer formed on a second surface of the core layer on an opposite side with respect to the first surface, and a plurality of through-hole conductors penetrating through the core layer and connecting the first conductor layer and the second conductor layer;
a first build-up layer comprising a first resin insulating layer formed on a first surface side of the core substrate, an inner side first conductor layer formed on the first resin insulating layer, a plurality of first via conductors penetrating through the first resin insulating layer and electrically connecting the first conductor layer and the inner side first conductor layer, an outermost first resin insulating layer formed on the inner side first conductor layer, an outermost first conductor layer formed on the outermost first resin insulating layer, and a plurality of outermost first via conductors penetrating through the outermost first resin insulating layer and electrically connecting the inner side first conductor layer and the outermost first conductor layer; and a second build-up layer comprising a second resin insulating layer formed on a second surface side of the core substrate on an opposite side with respect to the first surface side of the core substrate, an inner side second conductor layer formed on the second resin insulating layer, a plurality of second via conductors penetrating through the second resin insulating layer and electrically connecting the second conductor layer and the inner side second conductor layer, an outermost second resin insulating layer formed on the inner side second conductor layer, an outermost second conductor layer formed on the outermost second resin insulating layer, and a plurality of outermost second via conductors penetrating through the outermost second resin insulating layer and electrically connecting the inner side second conductor layer and the outermost second conductor layer, wherein the core substrate and the first and second build-up layers are formed such that each of the first and second conductor layers, the inner side first and second conductor layers, and the outermost first and second conductor layers comprises a metal foil, a seed layer formed on the metal foil, and an electrolytic plating film formed on the seed layer, that the plurality of first via conductors comprises the electrolytic plating film of the inner side first conductor layer, that the plurality of second via conductors comprises the electrolytic plating film of the inner side second conductor layer, that the plurality of outermost first via conductors comprises the electrolytic plating film of the outermost first conductor layer, that the plurality of outermost second via conductors comprises the electrolytic plating film of the outermost second conductor layer, and that a ratio t1/T1 is smaller than 1, a ratio t2/T2 is smaller than 1, a ratio u1/U1 is smaller than 1, a ratio u2/U2 is smaller than 1, a ratio s1/S1 is larger than 1, and a ratio s2/S2 is larger than 1, where t1 is a thickness of the electrolytic plating film of the first conductor layer, T1 is a thickness of the metal foil of the first conductor layer, t2 is a thickness of the electrolytic plating film of the second conductor layer, T2 is a thickness of the metal foil of the second conductor layer, u1 is a thickness of the electrolytic plating film of the outermost first conductor layer, U1 is a thickness of the metal foil of the outermost first conductor layer, u2 is a thickness of the electrolytic plating film of the outermost second conductor layer, U2 is a thickness of the metal foil of the outermost second conductor layer, s1 is a thickness of the electrolytic plating film of the inner side first conductor layer, S1 is a thickness of the metal foil of the inner side first conductor layer, s2 is a thickness of the electrolytic plating film of the inner side second conductor layer, and S2 is a thickness of the metal foil of the inner side second conductor layer.

2. The printed wiring board according to claim 1, wherein the ratio $t1/T1$, the ratio $t2/T2$, the ratio $u1/U1$ and the ratio $u2/U2$ are in a range of 0.6 to 0.9, and the ratio $s1/S1$ and the ratio $s2/S2$ are in a range of 1.5 to 4.

3. The printed wiring board according to claim 1, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

4. The printed wiring board according to claim 2, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

5. The printed wiring board according to claim 1, wherein the ratio $t1/T1$, the ratio $t2/T2$, the ratio $u1/U1$ and the ratio $u2/U2$ are in a range of 0.6 to 0.9.

6. The printed wiring board according to claim 5, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

7. The printed wiring board according to claim 1, wherein the ratio $t1/T1$ and the ratio $u1/U1$ are in a range of 0.6 to 0.9.

8. The printed wiring board according to claim 7, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

9. The printed wiring board according to claim 1, wherein the ratio $t1/T1$ and the ratio $t2/T2$ are in a range of 0.6 to 0.9.

10. The printed wiring board according to claim 9, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

11. The printed wiring board according to claim 1, wherein the ratio $s1/S1$ and the ratio $s2/S2$ are in a range of 1.5 to 4.

12. The printed wiring board according to claim 11, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

13. The printed wiring board according to claim 7, wherein the ratio $s1/S1$ and the ratio $s2/S2$ are in a range of 1.5 to 4.

14. The printed wiring board according to claim 13, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

15. The printed wiring board according to claim 9, wherein the ratio $s1/S1$ and the ratio $s2/S2$ are in a range of 1.5 to 4.

16. The printed wiring board according to claim 15, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

17. The printed wiring board according to claim 1, wherein the ratio $t1/T1$ is in a range of 0.6 to 0.9.

18. The printed wiring board according to claim 17, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

19. The printed wiring board according to claim 1, wherein the ratio u1/U1 is in a range of 0.6 to 0.9.

20. The printed wiring board according to claim 19, wherein the core substrate is formed such that each of the through-hole conductors is formed in a through hole having a first opening tapered from the first surface of the core layer toward the second surface of the core layer and a second opening tapered from the second surface of the core layer toward the first surface of the core layer.

* * * * *